United States Patent [19]

Nakase

[11] Patent Number: 5,216,630
[45] Date of Patent: Jun. 1, 1993

[54] STATIC SEMICONDUCTOR MEMORY DEVICE USING BIPOLAR TRANSISTOR

[75] Inventor: Yasunobu Nakase, Hyogo, Japan

[73] Assignee: Mitsubishi Denki Kabushiki Kaisha, Tokyo, Japan

[21] Appl. No.: 675,628

[22] Filed: Mar. 26, 1991

[30] Foreign Application Priority Data

Jun. 7, 1990 [JP] Japan .................... 2-149509

[51] Int. Cl.$^5$ ............... G11C 11/00; G11C 11/34; G11C 7/00
[52] U.S. Cl. .................... 365/155; 365/179; 365/190
[58] Field of Search ............ 365/155, 189.09, 189.11, 365/179, 190

[56] References Cited

U.S. PATENT DOCUMENTS

| | | | |
|---|---|---|---|
| 4,370,736 | 1/1983 | Takahashi | 365/155 |
| 4,536,860 | 8/1985 | Toyoda et al. | 365/190 |
| 4,601,014 | 7/1986 | Kitano et al. | 365/155 |
| 4,604,728 | 8/1986 | Okajima | 365/155 |

FOREIGN PATENT DOCUMENTS 57-17316 4/1982 Japan .
60-242584 12/1985 Japan .

Primary Examiner—Rolf Hille
Assistant Examiner—Robert Limanek
Attorney, Agent, or Firm—Lowe, Price, LeBlanc & Becker

[57] ABSTRACT

Disclosed is a bipolar SRAM including, in each memory cell, two NPN multiemitter transistors, with a base of one transistor being cross-connected to a collector of the other transistor. The respective collectors of these two multiemitter transistors in an arbitrary memory cell are connected to the same positive word line through a load. The first emitter of one of these two multiemitter transistors and the first emitter of the other transistor are connected to the same negative word line. Only when the positive word line corresponding to this negative word line is not selected, a data holding current flows to the negative word line from the first emitter of the transistor having a H level collector potential out of these two multiemitter transistors, and when the corresponding positive word line is selected, the negative word line is controlled not to allow the data holding current to flow. Furthermore, in a data writing, when the arbitrary memory cell is selected in order to reduce or eliminate a current flowing between a second emitter of one transistor of these two multiemitter transistors in the selected memory cell and a bit line connected thereto, the bit line is controlled.

48 Claims, 8 Drawing Sheets

STATIC SEMICONDUCTOR MEMORY DEVICE USING BIPOLAR TRANSISTOR

BACKGROUND OF THE INVENTION

1. Field of the Invention

The present invention relates generally to semiconductor memory devices, and more particularly, to static semiconductor memory devices (referred to as SRAM hereinafter) using bipolar transistors.

2. Description of the Background Art

Semiconductor memory devices include SRAM write data which is held unless a power supply is turned off. SRAMs are classified into a MOSSRAM including MOS transistors as components and a bipolar SRAM including bipolar transistors as components. A bipolar SRAM is used as a part of which a high speed operation is required such as a central portion of a CPU (central processing unit) because the bipolar SRAM operates at a higher speed than a MOSSRAM. FIG. 7 is a schematic block diagram showing an entire arrangement of a chip of a bipolar SRAM.

Referring to FIG. 7, a bipolar SRAM 100 comprises a memory array 1, a row address buffer-decoder 2, a column address buffer-decoder 3, read/write circuit 4, a sense amplifier 5, an output buffer 6, a word line discharging circuit-holding current control circuit 7 and a read/write control circuit 8. Bipolar SRAM 100 further comprises a row address terminal $T_{AX}$ receiving an externally applied row address signal, a column address terminal $T_{AY}$ receiving an externally applied column address signal, an input data terminal $T_{DI}$ receiving an externally applied write data, a control terminal $T_{CTL}$ receiving an externally applied write control signal and a data output terminal $T_{DO}$ externally outputting read data.

Memory array 1 includes memory cells MCs arranged in a matrix of rows and columns, two word lines WP and WN provided for each row, and a bit line pair BP provided for each column. Each bit line pair BP includes two bit lines, BTL and BTR. The word line WN is connected to word line discharging circuit-holding current control circuit 7. Only the word line WP is connected to row address buffer-decoder 2.

The internal arrangement and a basic operation principle of the memory cell MC will be described. FIG. 8 is a circuit diagram showing the basic arrangement of a memory cell of a bipolar SRAM. With reference to FIG. 8, the memory cell MC includes two NPN type multiemitter transistors QML and QMR connected crossing with each other and loads RML and RMR. Load RML is provided between the collector of transistor QML and the word line WP corresponding to the memory cell MC. Similarly, load RMR is provided between the collector of transistor QMR and said corresponding word line WP. One emitter of transistor QML and one emitter of transistor QMR are connected in common to the other word line WN corresponding to the memory cell MC. The other emitter of transistor QML is connected to the bit line BTL corresponding to the memory cell MC. The other emitter of transistor QMR is connected to the other bit line BTR corresponding to the memory cell MC. In the following description, the word line WP is referred to as a positive word line and the word line WN is referred to as a negative word line.

Complementary potentials corresponding to data held at a node between load RML and transistor QML and a node between load RMR and transistor QMR. The node between load RML and transistor QML and that between load RMR and transistor QMR are referred to as storage nodes NL and NR, respectively, in the following.

It is assumed that a potential $V_{NH}$ on the positive word line WP corresponding to a logical "H" level and a potential $V_{NL}$ corresponding to a logical level "L" are held at storage nodes NL and NR, respectively. In reading data from the memory cell MC, the potential on the positive word line WP corresponding to the memory cell MC is raised to a high potential $V_H$ (for example $-1.0$ V). The bit lines BTL and BTR are connected to constant current sources IRWL and IRWR, respectively. In response to the potential rise of the word line WP, the potential at storage node NL is raised to approximately the same potential $V_H$ on the positive word line WP. At the same time, the potential at storage node NR is also raised to a fixed potential $V_L$ (for example $-2.0$ V) lower than the potential $V_H$ at the node NL. Bit line BTL is connected to a power supply Vcc through an NPN type transistor QRWL for reading and writing. Similarly, the other bit line BTR is connected to power supply Vcc through an NPN transistor QRWR. In a data reading, a read reference potential $V_{RD}$ is applied to the bases of transistors QRWL and QRWR. Read reference potential $V_{RD}$ is a potential close to the intermediate value (for example, about $-1.6$ V) between the potential $V_H$ corresponding to a H level and the potential $V_L$ corresponding to a L level. The potential $V_L$ at storage node NR and the potential $V_H$ at storage node NL are applied to the bases of transistors QML and QMR, respectively.

Since transistor QML and transistor QRWL constitute an ECL (emitter coupled logic) with respect to constant current source IRWL, transistor QRWL is rendered conductive which receives at its base the potential $V_{RD}$ higher than the base potential $V_L$ of transistor QML. As a result, the current flows to bit line BTL from power supply Vcc through transistor QRWL, whereby the potential on bit line BTL becomes the potential $(-1.6$ V$-0.8$ V$=-2.4$ V) lower than the base potential $V_{RD}$ of transistor QRWL by a base-emitter voltage $V_{BE}$ ($\approx 0.8$ V) of the transistor. Similarly, transistors QMR and QRWR constitute an ECL with respect to constant current source IRWR. Transistor QMR receives a potential $V_H$ higher than that of storage node NL at its base. As a result transistor QMR is rendered conductive in this ECL, whereby a current flows to bit line BTR from positive word line WP at a H level potential through load RMR and transistor QMR, causing the bit line BTR to attain a low potential $(-1.0$ V$-0.8 = -1.8$ V) lower than the base potential $V_H$ of transistor QMR by the base-emitter voltage $V_{BE}$ of the transistor.

Conversely, when the potentials held at storage nodes NL and NR are at a L level and a H level, respectively, transistor QML is rendered conductive at bit line BTL side of the memory cell MC and transistor QRWR is rendered conductive at bit line BTR side. In this case, the potential on bit line BTL becomes $-1.8$ V and the potential on bit line BTR becomes $-2.4$ V. That is, the series-connection circuit of load RML and transistor QML constitutes an inverter IL inverting the potential at storage node NR and outputting the inversion to bit line BTL. Similarly, the series-connection circuit of load RMR and transistor QMR constitutes an inverter IR inverting the potential at storage node NL and outputting the inversion to bit line BTR. As a result, a potential difference is generated between BTL and BTR in a data reading. The potential difference is sensed by sense amplifier 5 in FIG. 7 to obtain the storage data of the selected memory cell MC.

In writing data to the memory cell MC, the potential on positive word line WP is raised to a high potential $V_H$ and complementary potentials corresponding to data to be written are applied to the bases of transistors QRWL and QRWR. It is assumed that data is already written in the memory cell MC so that the potentials at storage nodes NL and NR are at a H level and a L level, respectively. In this case, since transistors QML and QMR constitute the ECL, transistor QML is turned off and the other transistor QMR is turned on. In writing the reverse data to presently written data to the memory cell MC, that is, when the potentials at storage nodes NL and NR are inverted to a L level and a H level, respectively, the potential $V_{WL}$ (ordinarily −2.4 V) lower than the potential $V_L$ held at storage node NR is applied to the base of transistor QRWL and the potential $V_{WH}$ (ordinarily −0.8 V) higher than the potential $V_H$ held at storage node NL is applied to the base of transistor QRWR. As a result, transistor QML is switched from off to on state and transistor QRWL enters an off state. Meanwhile, transistor QMR is switched from on to off state and transistor QRWR enters an on state.

Turning-on of transistor QML causes a current to flow from positive word line WP through load RML and transistor QML to bit line BTL, thereby lowering the potential at storage node NL. Conversely, the turning-off of transistor QMR causes no current to flow from word line WP to load RMR, thereby raising the potential at storage node NR to the same potential as the potential $V_H$ on positive word line WP. At this time, a current flows to bit line BTR from power supply Vcc through transistor QRWR. As the foregoing, storage node NR is charged in response to the high potential on positive word line WP and storage node NL is discharged. The potential at storage node NR eventually becomes approximately equal to the potential $V_H$ on positive word line WP and the potential at storage node NL becomes a low level potential $V_L$.

Conversely, in a data writing wherein storage nodes NL and NR are forced to "H" and "L" potentials, respectively, the potential $V_{WH}$ and the potential $V_{WL}$ are applied to the base of transistor QRWL and the base of the transistor QRWR, respectively. In this case, transistor QRWL receiving a high potential at its base is turned on and transistor QML is turned off. At the same time, transistor QMR receiving a high potential at its base is turned on and transistor QRWR is turned off. Therefore in this case, no change is caused in the conduction state of transistors QML and QMR, whereby the potentials held at storage nodes NL and NR remain unchanged. The data thus written (the potentials at storage nodes NL and NR) should be held even after the end of the writing. When the potentials at storage nodes NL and NR attain respectively "L" and "H" in this writing, in order to maintain the logical levels of the potentials at storage nodes NL and NR, the on state of transistor QML and the off state of transistor QMR should be maintained even after the end of the writing. Conversely, when the potentials at storage nodes NL and NR attain "H" and "L" in the writing, the off state of transistor QML and the on state of QMR should be maintained even after the end of the writing. However, since the potential on positive word line WP is lowered to the original potential $V_{NH}$ after the end of the writing, the base potentials of transistors QML and QMR are lowered to the original potential $V_{NH}$ and $V_{NL}$, respectively, thereby preventing the conduction states of transistors QML and QMR from remaining the same as that in the data writing. The potentials at storage nodes NL and NR cannot be maintained when the conduction states of transistors QML and QMR change. That is, the data of the memory cell MC is damaged. Such data damage is prevented by flowing a small current all the time through negative word line WN from the memory cell MC. Negative word line WN is connected to one emitter unconnected to bit line BTL out of the two emitters of transistor QML and to one emitter unconnected to bit line BTR out of the two emitters of transistor QMR. In this method, current flows all the time from a storage node attaining a low level potential $V_L$ as a result of the writing to negative word line WN through a transistor turning on as a result of the writing out of transistors QML and QMR. Therefore, the potential at the storage node attaining a L level in the writing is maintained even after the end of the data writing. With inverters IL and IR cross-connected to each other, a maintained potential of the storage node of one inverter results in a maintained potential of the storage node of the other inverter. As a result, no storage data is damaged in the memory cell MC. As the foregoing, the current constantly flowed through negative word line WN to maintain the storage data of the memory cell MC is referred to as a data holding current. The potential on positive word line WP is raised to a H level only in the case of data writing and data reading of a memory cell connected thereto and the potential is lowered to the original level at the end of the data reading and data writing. In order to enhance the rate of a potential drop of positive word line WP, the electric charge stored in positive word line WP is extracted at a high speed through a memory cell and negative word line WN connected to the word line when the data writing and the data reading finish.

Back to FIG. 7, a row address signal applied to row address terminal $T_{AX}$ designates one of the positive word lines WPs in memory cell array 1, which one word line is connected to a memory cell to or from which line data is written or read. Similarly, a column address signal applied to column address terminal $T_{AY}$ designates one of the bit line pairs BPs in memory cell array 1, which pair is connected to a memory cell to or from which pair data is written or read. In response to the row address signal applied to row address terminal $T_{AY}$, row address buffer-decoder 2 supplies a high potential $V_H$ only to the word line WP designated by the row address signal among the positive word lines WPs in memory cell array 1. In response to the column address signal applied to column address terminal $T_{AY}$, column address buffer-decoder 3 selects the column designated by the column address signal among the columns corresponding to the respective bit line pairs BPs in memory array 1.

In response to a write enable signal $\overline{WE}$ applied to write control terminal $T_{CTL}$, read/write control circuit 8 controls read/write circuit 4 and word line discharging circuit-holding current source 7. Write enable signal $\overline{WE}$ designates whether a data writing or a data reading should be performed for memory array 1. When write enable signal $\overline{WE}$ designates a "data writing", read/- write control circuit 8 applies the input data signal $D_{IN}$ applied to input data terminal $T_{DI}$ to read/write circuit 4. Read/write circuit 4 includes write/read transistors QRWL and QRWR (see FIG. 8) provided for each bit line pair BP in memory array 1. In response to the applied input data signal $D_{IN}$, read/write circuit 4 supplies such a complementary base voltage as described above to only the transistors QRWL and QRWR corresponding to the column selected by column address buffer-decoder 3 among the read/write transistors QRWL and QRWR provided corresponding to the respective bit line pairs BPs. As a result, the data is written on such a principle as described above in the memory cell (selected memory cell) provided at a crossing point between the row designated by the row address signal and the column designated by the column address signal.

When write enable signal $\overline{WE}$ designates a "data reading", read/write control circuit 8 does not accept input data signal $D_{IN}$ applied to input data terminal $T_{DI}$. At this time, read/write circuit 4 applies, as a gate potential, the potential $V_{RD}$ which is the intermediate potential between the high level potential $V_H$ and the low level potential $V_L$ only to the write/read transistors QRWL and QRWR in the column selected by column address buffer-decoder 3. As a result, a potential difference is produced between the two bit lines constituting the bit line pair corresponding to the selected memory cell according to the storage data of the selected memory cell. Sense amplifier 5 senses and amplifies the potential difference to be output. Output buffer 6 buffers the signal output from sense amplifier 5, which buffered signal is provided to output data terminal $T_{DO}$ as the read data $D_{OUT}$ from the selected memory cell.

Word line discharging circuit-holding current control circuit 7 causes the holding current to flow through all the negative word lines WNs in memory array 1, while promoting the discharging of the selected word line in response to the stop of the high potential supply to the selected word line among the positive word lines WPs in memory array 1 in the data reading and the data writing.

A positive word line receiving a potential $V_H$ in a data reading or a data writing is referred to as a word line in a selected state or a selected word line hereinafter. Similarly, a bit line pair corresponding to a column selected by column address buffer-decoder 3 in a data writing and a data reading is referred to as a bit line pair in a selected state or a selected bit line pair.

FIG. 9 is a partial circuit diagram showing a specific circuit arrangement of a bipolar SRAM. The circuit system and the reading and writing method of the bipolar SRAM are disclosed in Japanese Patent Laying Open No. 60-242584, for example. FIG. 10 is a timing chart showing the operations in the data reading and the data writing of the bipolar SRAM having the arrangement shown in FIG. 9. With reference to FIGS. 9 and 10, a specific circuit operation of the bipolar SRAM will be described in detail in the following. While memory array 1 is illustrated in FIG. 9 as having four memory cells arranged in a matrix of two rows and two columns for the purpose of simplicity, it has an arrangement having more memory cells arranged in a matrix in practice.

With reference to FIG. 9, memory cells M11, M12, M21 and M22 are arranged in a matrix of two rows and two columns in memory array 1. The arrangement of each memory cell is as shown in FIG. 8. Memory cells M11 and M12 are connected in common to a positive word line WP1 and a negative word line WN1. Memory cells M21 and M22 are connected in common to a positive word line WP2 and a negative word line WN2 different from the positive word line WP1 and the negative word line WN1.

A row decoder XD includes a selection circuit $XD_1$ for selecting/non-selecting positive word line WP1 and a selection circuit $XD_2$ for selecting/non-selecting the other positive word line WP2.

Selection circuit $XD_1$ includes NPN type transistors Q1 and T1 constituting an ECL, and an NPN type transistor QWD1 having a base connected to the collector of transistor Q1. The collector of transistor Q1 is connected to a power supply Vcc through a resistor $RXD_1$ and the collectors of transistors T1 and QWD1 are directly connected to power supply Vcc. The emitter of transistor QWD1 is connected to positive word line WP1. The emitters of transistors Q1 and T1 are connected to a constant current source IXD1.

The other selection circuit $XD_2$ has the same arrangement as that of the selection circuit $XD_1$.

In response to an externally applied address signal, row decoder XD sets to a high potential one of a signal X1 to be applied to the base of transistor Q1 and a signal X2 to be applied to the base of transistor Q2 and sets the other signal to a low potential to select either positive word lines WP1 or WP2. A circuit operation of row decoder XD will be described.

The base potentials of transistors T1 and T2 are set to an intermediate potential VR between the high potential and the low potential. Thus, when the input signal X1 to the base of transistor Q1 attains a high potential and input signal X2 to the base of transistor Q2 attains a low potential, transistor Q1 is rendered conductive out of transistors Q1 and T1 in selection circuit $XD_1$. Conversely, in selection circuit $XD_2$, transistor T2 becomes conductive and transistor Q2 becomes non-conductive. The conduction of transistor Q1 causes a current to flow from power supply Vcc through resistor RXD1 and transistor Q1 to constant current source IXD1, whereby the collector potential of transistor X1 (the base potential of transistor QWD1) falls. Non-conduction of transistor Q2 prevents the current from flowing from power supply Vcc through a resistor RXD2 and transistor Q2 to a constant current source IXD2, whereby the collector potential of transistor Q2 (a base potential of a transistor QWD2) is raised in response to the output voltage of power supply Vcc, thereby rendering transistor QWD2 conductive. As a result, the potential on the other positive word line WP2 is raised to the high potential $V_H$ ($-1.0$ V) in response to the output voltage of power supply Vcc. Conversely, when input signal X1 attains a low potential and input signal X2 attains a high potential, transistor Q1 becomes non-conductive in selection circuit $XD_1$, thereby raising the potential on positive word line WP1 to a high level contrary to the former case.

In memory array 1, memory cells M11 and M21 are connected in common to a pair of two bit lines BTL1 and BTR1 constituting a bit line pair BP1. Memory cells M12 and M22 are connected in common to a pair of two bit lines BTL2 and BTR2 constituting a bit line pair BP2. Provided between the bit lines BTL1 and BTR1 are two diodes DBDL1 and DBDR1 connected in anti-series. Similarly, provided between bit lines BTL2 and BTR2 are two diodes DBDL2 and DBDR2 connected in anti-series. The node between diodes DBDL1 and DBDR1 and that between diodes DBDL2 and DBDR2 are connected in common to a constant current source BTDSCS.

Bit line pairs BP1 and BP2 are connected to a bit line clamp circuit BTCL. Bit line clamp circuit BTCL fixes the potentials on the two bit lines constituting the non-selected bit line pair to the same potential.

Bit line clamp circuit BTCL includes a clamp circuit BTCL1 provided corresponding to bit line pair BP1 and a clamp circuit BTCL2 provided corresponding to bit line pair BP2.

Clamp circuit BTCL includes an NPN type transistor QBCL1 having an emitter connected to bit line BTL1 and a collector connected to power supply Vcc and an NPN type transistor QBCR1 having an emitter connected to bit line BTR1 and a collector connected to power supply Vcc. The base of transistor QBCL1 and the base of transistor QBCR1 are connected to power supply Vcc through a common resistor RBC1 and diode D.

Clamp circuit BTCL2 has the same arrangement as that of the clamp circuit BTCL1.

A read/write circuit RWb includes NPN type transistors STa1, STc1, STa2 and STc2 provided corresponding to all the bit lines BTL1, BTR1, BTL2 and BTR2, respectively in memory array 1. Read/write circuit RWb further includes NPN type transistors STb1 and STb2 respectively provided corresponding to a base node NBC1 between transistors QBCL1 and QBCR1 and a base node NBC2 between transistors QBCL2 and QBCR2. Respective transistors STa1 and STa2 are connected in series between the corresponding bit lines BTL1 and BTL2, and a constant current source IRWL. Respective transistors STc1 and STc2 are connected in series between the corresponding bit lines BTR1 and BTR2, and constant current source IRWR. Respective transistors STb1 and STb2 are connected in series between the corresponding base nodes NBC1 and NBC2 in bit line clamp circuit BTCL and a constant current source IBTCL. The base voltages of these transistors STa1, STb1, STc1, STa2, STb2 and STc2 are controlled by a column decoder YD.

Column decoder YD includes a selection circuit YD1 for selecting/non-selecting bit line pair BP1 and a selection circuit YD2 for selecting/non-selecting bit line pair BP2.

Selection circuit YD1 includes two NPN type transistors Q3 and T3 constituting an ECL and an NPN type transistor QBD1 having a base connected to the collector of transistor Q3. The collector of transistor Q3 is connected to power supply Vcc through a resistor RYDa1 and a diode DYa1. The collector of transistor T3 is connected to the diode DYa1 through a resistor RYDb1. The emitters of transistors Q3 and T3 are connected in common to a constant current source IYDa1. The collector of transistor QBD1 is directly connected to power supply Vcc. The emitter of transistor QBD1 is connected to the bases of transistors STa1, STb1 and STc1 in read/write circuit RW$_b$ and a constant current source IYDb1 through a diode DYb1.

A selection circuit YD2 has the same arrangement as that of the selection circuit YD1.

A description will be made of column decoder YD, read/write circuit RWb and bit line clamp circuit BTCL.

Column decoder YD causes one of a signal Y1 to be applied to the base of transistor Q3 and a signal Y2 to be applied to a base of a transistor Q4 to have a high potential and causes the other signal to have a lower potential, in response to an external column address signal, to select one of the bit line pairs BP1 and BP2. It is assumed, for example, that signal Y1 applied to the base of transistor Q3 is raised to a high potential and signal Y2 applied to the base of transistor Q4 is dropped to a low potential. In this case, in a selection circuit YD1, transistor Q3 out of transistors Q3 and T3 becomes conductive to generate a current flowing from power supply Vcc to diode DYa1, resistor RYDa1 and transistor Q3. As a result, the collector potential of transistor Q3 is lowered, whereby an output signal YS1 (hereinafter referred to as a bit line selecting signal) of selection circuit YD1 is lowered to turn off transistors STa1, STb1 and STc1. Consequently, the connections are electrically cut off between bit line BTL1 and constant current source IRWL, between bit line BTR1 and constant current source IRWR and between the base node NBC1 in bit line clamp circuit BTCL and constant current source IBTCL. At the same time, in selection circuit YD2, input signal Y2 is lowered to turn on transistor T4 and turn off transistor Q4, whereby the collector potential of transistor Q4 is raised in response to the output voltage of power supply Vcc to render a transistor QBD2 conductive contrary to the case of selection circuit YD1. As a result, the current is generated which flows from a diode DYb2 to the bases of transistors STa2, STb2 and STc2 provided corresponding to bit line pair BP2 in a read/write circuit RWb. That is, a bit line selecting signal YS2 from selection circuit YD2 is raised to render transistors STa2, STb2 and STc2 conductive, thereby electrically connecting bit line BTL1 to constant current source IRWL, bit line BTR2 to constant current source IRWR and base node NBC2 in bit line clamp circuit BTCL to constant current source IBTCL.

As the foregoing, when input signal Y2 to selection circuit YD2 is at a low potential, bit line pair BP2 is selectively electrically connected to constant current sources IRWL, IRWR and IBTCL. As a result, the current flows from power supply Vcc to constant current source IBTCL through diode D, a resistor RBC2 and transistor STb2, whereby the potential at base node NBC2 falls. Therefore, transistors QBCL2 and QBCR2 become nonconductive. Conversely, since no current is generated which flows to resistor RBC1, the potential at the base node NBC1 between QBCL1 and QBCR1 rises in response to the output voltage of power supply Vcc, thereby rendering transistors QBCL1 and QBCR1 conductive to supply a high potential to bit lines BTL1 and BTR1. As a result, diodes DBDL1 and DBDR1 are forward biased to become conductive, thereby short-circuiting bit line BTL1 and bit line BTR1. With the current flowing from the cathodes of diodes DBDL1 and DBDR1 maintained constant by constant current source BTDSCS, bit lines BTL1 and BTR1 are held to the same fixed potential. That is, in this case bit line pair BP1 is not selected and bit line pair BP2 is selected.

Conversely, when input signal Y1 to selection circuit YD1 attains a low potential and input signal Y2 to selection circuit YD2 attains a high potential, signal YS1 applied to the bases of transistors STa1, STb1 and STc1 provided corresponding to bit line pair BP1 attains a high potential. At the same time, signal YS2 applied to the bases of transistors STa2, STb2 and STc2 provided corresponding to bit line pair BP2 attains a low potential. Consequently, in this case, bit line pair BP1 is selected and bit line pair BP2 is not selected.

Read/write circuit RWb further includes reading and writing transistors QRWL1 and QRWR1 provided corresponding to bit line pair BP1 and reading and writing transistors QRWL2 and QRWR2 provided corresponding to bit line pair BP2. Transistors QRWL1 and QRWR1 are provided between power supply Vcc and, bit line BTL1 and bit line BTR1, respectively, which bit lines constituting bit line pair BP1. Similarly, transistors QRWL2 and QRWR2 are provided between power supply Vcc and, bit line BTL2 and bit line BTR2, respectively, which bit lines constituting bit line pair BP2. A base potential TRB of transistors QRWL1 and QRWL2 and a base potential TRA of transistors QRWR1 and QRWR2 are controlled by a read/write control circuit RWC.

Read/write control circuit RWC controls the base potentials of transistors QRWL1 and QRWL2 and transistors QRWR1 and QRWR2 in response to an external write enable signal $\overline{WE}$ and input data signal $D_{IN}$ such that transistors QRWL1 and QRWL2 and transistors QRWR1 and QRWR2 operate in the data reading and data writing as described above.

A data holding current control circuit 7a includes constant current sources IH1 and IH2 connected to negative word lines WN1 and WN2, respectively. Constant current source IH1 holds the storage data of memory cells M11 and M12 by causing a small current to flow to negative word line WN1 at any time. Similarly, constant current source IH2 causes a small current to flow to the other negative word line WN2 at any time to hold the storage data of memory cells M21 and M22.

A word line discharging circuit 7b includes a diode QDD1 having an anode connected to negative word line WN1, a diode QDD2 having an anode connected to the other negative word line WN2, and a constant current source IWDCS. Constant current source IWDCS is connected in common to the cathodes of diodes QDD1 and QDD2. The potentials on negative word lines WN1 and WN2 rise/fall in response to the potential rise/fall of the corresponding positive word lines WP1 and WP2, respectively. Therefore, the change of positive word line WP1 from a selected state to a non-selected state causes the electric charges to be discharged through diode QDD1, whereby the current defined by constant current source IWDCS flows from positive word line WP1 through memory cells M11 and M12 and negative word line WN1 to constant current source IWDCS. As a result, the electric charges stored in positive word line WP1 are extracted at a high speed to rapidly render positive word line WP1 non-selected. The change of positive word line WP2 from a selected state to a non-selected state causes the electric charges to be discharged through diode QDD2. In this case, the electric charges stored in positive word line WP2 are accordingly extracted by constant current source IWDCS at a high speed to rapidly return positive word line WP2 to a non-selected state. As the foregoing, the current flowing for rapidly returning a positive word line to a non-selected state is referred to as a word line discharging current. The arrangement and the operation of word line discharging circuit 7b shown in FIG. 9 is disclosed in more detail in Japanese publication No. 57-17316, for example.

Referring to FIGS. 8 to 10, the data reading operation of the bipolar SRAM will be described. It is assumed in this description that memory cell M11 is selected and storage nodes NR and NL of memory cell M11 are held at a H level and a L level, respectively.

With reference to FIG. 9, when the data is read from memory cell M11, signal X1 in row decoder XT shifts from a H level to a L level in response to an external row address signal at a time $t_0$. As a result, positive word line WP1 rises to a high potential $V_H$ from a low potential $V_{NH}$. Consequently, the potential on negative word line WN1 rises to the potential lower than the potential $V_H$ on positive word line WP1 by a base-to-emitter voltage $V_{BE}$ of on state transistors QML or QMR in memory cells M11 or M12. In this way, negative word line WN1 enters a selected state out of a non-selected state. As a result, the potential as storage node NR of memory cell M11 rises from the level $V_{NH}$ of a non-selected state to a level $V_H$ of a selected state as indicated by ① in FIG. 10. Similarly, the potential at the other storage node NL of memory cell M11 rises from the level $V_{NL}$ at non-selected state to the level $V_L$ at a selected state as indicated by ② in FIG. 10.

On the other hand, signals Y1 and Y2 in column decoder YD attain a L level and a H level, respectively, in response to the external column address signal. As a result, bit line selecting signal YS1 attains a H level to select bit line pair BP1, whereby bit line BTL1 is electrically connected to constant current source IRWL and bit line BTR1 is electrically connected to constant current source IRWR. Furthermore, resistor RBC1 is electrically connected to constant current source IBTCL. In this way, bit line pair BP1 enters a selected state out of a non-selected state.

The resistance value of resistor RBC1 is set such that the potential at base node NBC1 is lower than the potential $V_L$ when the current defined by constant current source IBTCL flows to resistor RBC1. Similarly, the resistance value of resistor RBC2 is set to allow the potential at base node NBC2 to be lower than the potential $V_L$ when the current defined by constant current source IBTCL flows to the resistors RBC2. The reason for these resistance values of resistors RBC1 and RBC2 will be explained in the following and therefore no description thereof will be made here.

At the same time, the external write enable signal $\overline{WE}$ attains a H level-designating "data reading mode" in the data reading. In response to the H level write enable signal $\overline{WE}$, read/write control circuit RWC controls base potentials TRA and TRB of read/write transistors QRWL1 and QRWR1 to become the intermediate potential $V_{RD}$ between potentials $V_L$ and $V_H$ of storage nodes NL and NR, respectively, of the selected memory cell M11.

The respective transistors of the four transistors each having the emitter connected to bit line BTL1, that is, transistors QRWL1 and QBCL1 and transistors QMLs of memory cells M11 and M21 constitute an ECL for constant current source IRWL. The transistor QML of memory cell M11 having the highest base potential $V_H$ among these four transistors conducts, thereby supplying current to constant current source IRWL. Similarly, transistors QRWR1 and QBCR1 and the respective transistors QMRs of memory cells M11 and M21 constitute an ECL for constant current source IRWR. Therefore, transistor QRWR1 having the highest base potential $V_{RD}$ among these four transistors conducts, thereby supplying current to constant current source IRWR.

The potential on bit line BTL1 is determined by the base potential of the conducting transistor among the transistors each having the emitter connected to bit line BTL1. Thus, bit line BTL1 attains the potential $V_H - V_{BE}$ lower than the base potential $V_H$ of transistor QML in memory cell M11 by the base-to-emitter voltage $V_{BE}$ of the transistor. Similarly, the potential on bit line BTR1 is determined by the base current of the conducting transistor among the transistors connected to BTR1. Thus, bit line BTR1 attains the potential $V_{RD} - V_{BE}$ lower than the base potential $V_{RD}$ of transistor QRWR1 by the base-to-emitter voltage $V_{BE}$. As a result, the potential difference $V_H - V_{RD}$ is produced between the selected bit lines BTL1 and BTR1. The potential difference $V_H - V_{RD}$ is the potential difference to be sensed by a sense amplifier (not shown).

A writing operation of the bipolar SRAM will be described taking data writing in memory cell M11 as an example. In this description, it is assumed that a L level potential and a H level potential are already held at storage nodes NL and NR of memory cell M11.

Consideration is given to a rewriting of data of memory cell M11, that is, the inversion of the potentials at storage nodes NL and NR of memory cell M11 to a H level and a L level, respectively. In this case, input data terminal $T_{DI}$ of FIG. 7 receives as an input signal $D_{IN}$ a data signal corresponding to the data opposite to the data already stored in memory cell M11. The external write enable signal $\overline{WE}$ is set to a L level designating a "writing mode". Read/write control circuit RWC sets the base potential TRA of read/write transistor QRWR1 (FIG. 10 (4)) to a predetermined potential $V_{WL}$ lower than the potential $V_L$, and sets the base potential TRB of read/write transistor QRWL1 (FIG. 10 (3)) to a predetermined potential $V_{WH}$ higher than the potential $V_H$ in response to the L level write enable signal $\overline{WE}$ and the input data signal $D_{IN}$.

Row decoder XD operates similarly to select positive word line WP1 as in the data reading. As a result, the potential on positive word line WP1 rises to a H level potential $V_H$. At the same time, column decoder YD operates similarly to select bit line pair BP1 as in the data reading. As a result, bit lines BTL1 and BTR1 constituting bit line pair BP1 are electrically connected to constant current sources IRWL and IRWR, respectively. Then, the base node NBC1 in bit line clamp circuit BTCL is electrically connected to constant current source IBTCL. Just as in the data reading, the potentials as storage nodes NL and NR in memory cell M11 become the potentials $V_L$ and $V_H$ higher than the potentials $V_{NL}$ and $V_{NH}$ in the non-selected state, respectively. It is assumed herein that the potential $V_L$ at storage node NL maintaining a L level potential in the selected memory cell M11 is set to be higher than the potential $V_{NH}$ at the storage node maintaining a H level in the non-selected memory cell M21. In this case, such a relation as follows is established among potentials $V_H$ and $V_L$ of a storage node of a selected memory cell, potentials $V_{NH}$ and $V_{NL}$ of a storage node of a non-selected memory cell and the base potentials $V_{WH}$ and $V_{WL}$ of reading/writing transistors QRWL1 and QRWR1.

$$V_{WH} > V_H > (V_{RD}) > V_L > V_{WL} > V_{NH} > V_{NL}$$

At this time, irrespective of the held data of memory cell M21, transistor QMR of memory cell M11 has the highest base potential among the transistors each having the emitter connected to bit line BTR1 to constitute the ECL with respect to constant current source IRWR. On the other hand, irrespective of the held data of memory cell M21, reading/writing transistor QRWL1 has the highest base potential among the transistors each having the emitter connected to bit line BTL1 to constitute the ECL with respect to constant current source IRWL. Transistor QMR accordingly conducts in memory cell M11 and transistor QML becomes non-conductive. As a result, the current flows through RMR, thereby lowering the potential at storage node NR after the time $t_1$ to FIG. 10. Conversely, the electric charge supplied from positive word line WP1 to storage node NL raises the potential at storage node NL after the time $t_1$ of FIG. 10. Ultimately, the potential at storage node NL rises to the potential $V_H$ on the selected positive word line WP1 which is higher than the potential at storage node NR. In this way, the data of memory cell M11 is rewritten.

As the foregoing, in a conventional bipolar SRAM, the base potentials of transistors QMR and QML of the selected memory cell in a data reading are set to be higher than the base potentials of transistors QMR and QML of the non-selected memory cell having the emitter connected to the same bit line connected to this memory cell. That is, the potential $V_L$ at the storage node maintaining the L level of the selected memory cell is set to be higher than the potential $V_{NH}$ of the storage node maintaining the H level of the non-selected memory cell. Thus, a margin of a potential difference $V_M$ between the potential $V_L$ and the potential $V_{NH}$ is required as shown in FIG. 10.

The inversion of the relation between the potential $V_L$ and the potential $V_{NH}$ ($V_L < V_{NH}$ is established) causes such a phenomenon as follows.

In writing data different from that already held in an arbitrary memory cell, for example, in writing data to memory cell M11 as described above, transistor QMR of non-selected memory cell M21 has the highest base potential among the transistors constituting the ECL with respect to constant current source IRWL (in a case where memory cell M21 stores the opposite data to the held data in memory cell M11 so that the storage node NL of memory cell M11 has the potential $V_{NH}$). Transistor QMR of the non-selected memory cell M21 accordingly conducts and transistor QMR in memory cell M11 which is supposed to conduct becomes non-conductive. As a result, the potential at storage node NR in the selected memory cell M11 does not fall, so that the storage data of the selected memory cell M11 cannot be inverted. In order to avoid such problem, circuit factors should be settled to establish the relation $V_L > V_{NH}$ between the potentials $V_L$ and $V_{NH}$ in a data writing. That is, the potential $V_{NH}$ cannot take the value between the potentials $V_N$ and $V_H$. It is therefore not possible to set a potential difference $V_H - V_{NH}$ between a potential on a selected word line and a potential on a non-selected word line to be smaller than a potential difference (referred to as a logical amplitude of a memory cell) $V_H - V_L$ between storage nodes NL and NR of the selected memory cell.

Conversely, correct data reading from a selected memory cell requires one of transistors QML and QMR to be rendered conductive having a base receiving a potential $V_H$ at a storage node NL or NR maintaining a H level of the selected memory cell and of the other to be rendered non-conductive. This requires the potential $V_H$ at the storage node maintaining the H level of the selected memory cell to be higher than the potential $V_{NH}$ at the storage node maintaining the H level of the non-selected memory cell. This restriction is not so severe as in a data writing. As a result, a difference between the potential at the storage node of the selected memory cell and that at the storage node of the non-selected memory cell is larger than is required in a data reading.

The recent increased capacity of a semiconductor memory device has been followed by an increase in the number of memory cells of the semiconductor memory device. The increase in the number of memory cells means an increase of a total load amount coupled to positive word lines WP1 and WP2 driven by transistors QWD1 and QWD2, respectively in row decoder XD shown in FIG. 9. That is, the parasitic capacitances of the positive word lines WP1 and WP2 with respect to transistors QWD1 and QWD2 are increased. As a result, more time is required of transistors QWD1 and QWD2, respectively. That is more charging time of positive word lines WP1 and WP2 is required. Positive word lines WP1 and WP2 are raised by transistors QWD1 and QWD2, respectively, from the low potential $V_{NH}$ to the high potential $V_H$ to change from a non-selected state to a selected state. Such an increase in the charging time therefore increases a time period required of positive word lines WP1 and WP2 to change from a non-selected state to a selected state. The charging time of positive word lines WP1 and WP2 also depends on a difference $|V_{NH}-V_H|$ (word line amplitude) between the potential $V_{NH}$ on positive word lines WP1 and WP2 at a non-selected state and the potential $V_H$ on the same at a selected state. In other words, the larger the word line amplitude is, the longer becomes a time period required of transistors QWD1 and QWD2 to raise the potentials on positive word lines WP1 and WP2 to a predetermined selected potential $V_H$.

Consideration will be given of a circuit operation in data reading, for example, in reading data from memory cell M11. When the potential at storage nodes NL or NR maintaining the H level in memory cell M11 exceeds the base potential $V_{RD}$ of reading and writing transistors QRWL1 or QRWR1 in response to the potential rise of the selected positive word line WP1, the transistor conducts which receives, at its base, the potential of the storage node maintaining the H level out of transistors QML and QMR in memory cell M11. As a result, a potential difference is produced between bit lines BTL1 and BTR1, thereby enabling a data reading. A time (access time) required of data to be read from the actually designated memory cell after a memory cell to be selected is designated is accordingly proportional to a time tA1 required of the potential $V_{NH}$ at the storage node maintaining the H level of the selected memory cell to exceed the reading reference voltage $V_{RD}$. The rate of the potential rise of the storage node of the selected memory cell is proportional to the rate of the potential rise of the selected word line. Thus, the longer the time required of positive word lines WP1 and WP2 to enter a selected state from a non-selected state, the more is increased the time tA1, thereby increasing an access time in the data reading.

Therefore, in order to prevent increase of an access time of a bipolar SRAM in consideration of the recent increase in the number of memory cells, a word line amplitude should be reduced. One of prior art for avoiding such an increase in an access time is the technique disclosed in U.S. Pat. No. 4,536,860.

SUMMARY OF THE INVENTION

An object of the present invention is to provide a static semiconductor memory device using bipolar transistors of which the increase of an access time with the increase of the number of memory cells can be prevented.

Another object of the present invention is to provide a static semiconductor memory device using bipolar transistors in which an amplitude of a word line can be reduced.

A further object of the present invention is to reduce an access time of a static semiconductor memory device using bipolar transistors in a different manner from that of prior art.

A further object of the present invention is to provide a static semiconductor memory device using bipolar transistors which does not require addition of a limitation only for data writing to a set value of a word line amplitude.

A further object of the present invention is to provide a static semiconductor memory device using bipolar transistors by which both data reading and writing times can be reduced.

In order to achieve the above-described objects, the static semiconductor memory device according to the present invention includes a memory cell array including a plurality of memory cells arranged in a matrix of rows and columns, first and second word lines provided corresponding to the respective rows, first and second bit lines provided corresponding to the respective columns, a selection circuit for selecting one memory cell of the memory cell array in response to an address signal and a data holding current control circuit. The data holding current control circuit flows a data holding current for holding the storage data of the selected memory cell onto the second word lines connected to the memory cells not selected by the selection circuit and cuts off the data holding current flowing on the second word line connected to the memory cell selected by the selecting circuit in a data writing. Each memory cell includes first and second multiemitter transistors. The collector of the first multiemitter transistor and the base of the second multiemitter transistor are connected to each other and the collector of the second multiemitter transistor and the base of the first multiemitter transistor are connected to each other. The first emitters of the first and the second multiemitter transistors of the memory cell are connected to the second word line of the corresponding row. The collectors of the first and second multiemitter transistors of the memory cell are connected to the first word line of the corresponding row through a load. The second emitter of the first multiemitter transistor and the second emitter of the second multiemitter transistor of each memory cell are connected to the first bit line and the second bit line of the corresponding column, respectively. The static semiconductor memory device according to the present invention includes a bit line conduction state controlling circuit responsive to the data to be written for rendering conductive one of the first and the second bit lines connected to the memory cell selected by the selection circuit and rendering the other no-conductive in the data writing.

In the static semiconductor memory device arranged as described above according to the present invention, when the transistor is turned off which has the second emitter connected to the bit line rendered non-conductive by the bit line conduction state controlling circuit out of the first and the second multiemitter transistors included in the selected memory cell, almost no current flows from the collector of this transistor neither to the second word line connected to the first emitters of the first and the second multiemitter transistors nor to the non-conductive bit line, whereby the base potential of the other transistor having the second emitter connected to the bit line rendered conductive rises. As a result, the base potential of the arbitrary transistor constituting the ECL together with the other transistor becomes higher than the base potential of the other transistor to turn on the other transistor.

According to a preferred embodiment, the selection circuit includes a word line selecting circuit for raising a potential on a first word line provided corresponding to one of the rows to a high potential of a word line selecting potential and lowering the potentials on the first word lines provided corresponding to all the other rows to low potentials of word line non-selecting potentials to select the first and the second word lines corresponding to the one row and a bit line selecting circuit for controlling a bit line conduction state control circuit to render conductive a first bit line and a second bit line provided corresponding to one of the columns to select the first and the second bit line provided corresponding to the one column. The data holding current control circuit includes first constant current sources each provided corresponding to each of the second word lines, and a first connection control circuit for electrically connecting the respective second word lines corresponding to all the first word lines not selected by the word line selecting circuit with the corresponding first constant current sources and electrically cutting off the second word line selected by the word line selecting circuit from the corresponding first constant source. The bit line connection state control circuit includes second constant current sources each provided corresponding to each of the first and the second bit lines; and a second connection control circuit for electrically connecting one of the first and the second bit lines selected by the bit line selecting circuit with a corresponding second constant source and electrically cutting off the other from the corresponding second constant current source in a data writing. More preferably, the static semiconductor memory device according to the present invention includes a forcing circuit for forcing conductive one of the first and the second multiemitter transistors which are included in the memory cell connected to the selected first and second bit lines, in a data writing, and a data damage preventing circuit for preventing damage of the respective storage data of the memory cells connected to the first and the second bit lines not selected by the bit line selecting circuit and connected to the first and the second word lines selected by the word line selecting circuit.

The bit line selecting circuit includes for example, a bit line selecting potential applying circuit for applying, to the bases of the first and the second transistors respectively corresponding to the first and second bit lines provided corresponding to one of the columns, bit line selecting potentials higher than the base potentials of the other first and second transistors. Each first transistor is provided between each first bit line and the corresponding second constant current source and each second transistor is provided between each second bit line and the corresponding second constant current source. In this case, the second connection control circuit includes, for example, a first control transistor constituting an ECL with respect to the corresponding second constant current source together with all the first transistors, a second control transistor constituting an ECL with respect to the corresponding second constant current source together with all the second transistors, and a base potential supplying circuit for supplying a base potential to the first control transistor and the second control transistor. The base potential supplying circuit supplies complementary potentials with respect to a selecting potential to the bases of the first control transistor and the second control transistor, respectively, in a data writing.

The first connection control circuit includes for example, third and fourth transistors provided corresponding to each of the first constant current sources and constituting an ECL with respect to the corresponding first constant current source and a base potential control circuit for controlling the base potential of the third transistor. The base of the fourth transistor is supplied with a reference potential at any time. The base potential control circuit includes a plurality of fifth transistors for controlling the base of the third transistor corresponding to the selected second word line and the bases of the third transistors corresponding to the non-selected second word lines to a potential higher than the reference potential and a potential lower than the same, respectively. Each of the fifth transistors has a base connected to the corresponding first word line, an emitter connected to the base of the third transistor corresponding to the second word line corresponding to the corresponding first word line and a collector connected to the power supply.

The forcing circuit includes for example, sixth transistors each provided corresponding to each of the corresponding first bit lines and constituting an ECL together with the first multiemitter transistor connected to the corresponding first bit line with respect to the first constant current source corresponding to the corresponding first bit line, seventh transistors each provided corresponding to each of the second bit lines and constituting an ECL together with the corresponding second bit line with respect to the second constant current source corresponding to the corresponding second bit line, and a first potential applying circuit. The first potential applying circuit applies a first potential lower than the base potential of the non-conductive one of the first and the second multiemitter transistors included in the selected memory cell and lower than the word line non-selecting potential to both the bases of the sixth and the seventh transistors provided corresponding to the respective columns, in a data writing.

The data damage preventing circuit includes for example, first constant current source and a circuit for electrically connecting all the first and the second bit lines not selected by the bit line selecting circuit with the first constant current source and electrically cutting off the first and the second bit lines selected by the bit line selecting circuit from the first constant current source.

According to another preferred embodiment, the bit line conduction state control circuit is replaced by a bit line control circuit responsive to the data to be written for rendering conductive one of the first and the second bit lines connected to the memory cell selected by the selection circuit and fixing the other to the potential higher than the base potential of the transistor connected to the other, out of the first and the second multiemitter transistors of the selected memory cell.

The bit line control circuit includes the first and the second transistors provided corresponding to the respective columns and a base potential control circuit for controlling a base potential of each of these transistors. Each first transistor has an emitter connected to a first word line of the corresponding column, a collector connected to the power supply and a base. Each second transistor has an emitter connected to a second word line of the corresponding column, a collector connected to the power supply and a base. The base potential control circuit raises to a high potential the base of one of the first and the second transistors connected to the first and the second bit lines, respectively, selected by the bit line selecting circuit and the base of the other transistor to a low potential, in a data writing. The low potential is lower than the base potential of the non-conductive transistor out of the first and second multiemitter transistors included in the selected memory cell and lower than the word line no-selecting potential. The base potential control circuit includes for example, first constant current sources provided corresponding to the respective first and second transistors, a connection control circuit for electrically connecting a base of one of the first and second transistors connected to the selected first and second bit lines, respectively, with the corresponding first constant current source and electrically cutting off the base of the other transistor from the corresponding first constant current source, and a high potential applying circuit for applying the high potential through a load to the bases of the first and the second transistors connected to the selected first and second bit lines, respectively, in a data writing.

Like the previous preferred embodiment, the bit line selecting circuit includes a bit line selecting potential applying circuit for applying to the bases of the third and fourth transistors corresponding to the first and the second bit lines provided corresponding to one column, respectively, a bit line selecting potential higher than the base potentials of the other third and fourth transistors. Each third transistor is provided between each first bit line and a second constant current source and each fourth transistor is provided between each second bit line and a second constant current source. In this case, the high potential applying circuit and the bit line selecting circuit can be achieved by a common circuit. That is, the common circuit can be used which comprises means for simultaneously generating high potentials to be applied to the bases of the first and the third transistors corresponding to the first bit line of one column and to the bases of the second and the fourth transistors corresponding to the second bit line of the one column. The connection control circuit includes, for example, fifth transistors each provided corresponding to each first transistor and having a collector connected to the base of the corresponding first transistor, an emitter connected to the corresponding first constant current source and a base; sixth transistors each provided corresponding to each second transistor and having a collector connected to the base of the corresponding first transistor, an emitter connected to the corresponding first constant current source and a base; a first control transistor constituting an ECL together with the fifth transistors with respect to the corresponding first constant current source, a second control transistor constituting an ECL together with the sixth transistors with respect to the corresponding first constant current source and a base potential supplying circuit for supplying a base potential to the first and the second control transistors. A bit line selecting potential is applied to the base of the fifth transistor corresponding to the first transistor connected to the selected first bit line and to the base of the sixth transistor corresponding to the second transistor connected to the selected second bit line. The base potential supplying circuit supplies a potential higher than a bit line selecting potential to one of the bases of the first control transistor and the second control transistor and supplies a potential lower than the bit line selecting potential to the other.

According to the static semiconductor memory device of the present invention, in data writing, a reverse bias is applied between a second emitter of a multiemitter transistor connected to a bit line fixed to a high potential out of first and second multiemitter transistors of a selected memory cell and the bit line fixed to a high potential. In addition, in data writing, the selected memory cell is electrically cut off from the second word line connected to the selected memory cell. In the data writing therefore, no current is generated which flows between the reverse biased multiemitter transistor out of the first and the second multiemitter transistors of the selected memory cell and the bit line and the word line connected thereto.

It is assumed that the collector potential of the first multiemitter transistor of the selected memory cell is at a L level and the collector potential of the second multiemitter transistor of the selected memory cell is at a H level. In this case, in data writing, when the first bit line connected to the selected memory cell is fixed to a high potential, a reverse bias is applied between the second emitter of the first multiemitter transistor in the selected memory cell and the first bit line, thereby cutting off the current flowing from the base of the first multiemitter transistor to the first and the second emitters. On the other hand, a forward bias is applied between the base and the collector of the first multiemitter transistor. Therefore, the current flows from the base toward the collector of the first multiemitter transistor. This current supplies electric charges to the base of the second multiemitter transistor in the selected memory cell, thereby raising the base potential of the second multiemitter transistor with increasing speed. The second bit line connected to the second multiemitter transistor is at a state allowing current flow, so that the second multiemitter transistor conducts in response to the base potential rise. As a result, the collector potential of the second multiemitter transistor (the base potential of the first multiemitter transistor) falls.

Conversely, in data writing when the second bit line connected to the selected memory cell is fixed to a high potential, the current is cut off which flows from the first and the second emitters of the second multiemitter transistor in the selected memory cell to the second word line and the second bit line. However, since the reverse bias is applied between the base and the collector of the second multiemitter transistor, the base potential of the first multiemitter transistor does not rise. Meanwhile, the first bit line is at a state allowing current flow, so that the first multiemitter transistor in the selected memory cell conducts in response to a H level base potential. Therefore, the base potential of the first multiemitter transistor is maintained at a H level and the base potential of the second multiemitter transistor is maintained at a L level.

Any of the above-described static semiconductor devices according to the preferred embodiments may include or may not include a word line discharging current control circuit responsive to a potential of an arbitrary first word line changing from a high potential to the low potential for causing a word line discharging current to flow which promotes discharging of the arbitrary first word line to the second word line corresponding to the arbitrary first word line. In addition, in any of the above-described embodiments, the base potential supplying circuit includes for example, an inverter for inverting a written data signal to be written in a memory cell, a 2-input AND gate responsive to the output of the inverter and a write control signal for controlling data writing to a memory cell for generating a base potential of a first control transistor and a 2-input AND gate responsive to the written data signal and the write control signal for generating a base potential of a second control transistor.

According to another aspect, the static semiconductor memory device according to the present invention includes a memory cell array including a plurality of memory cells arranged in a matrix of rows and columns, first and second word lines provided corresponding to the respective rows, first and second bit lines provided corresponding to the respective columns, a selecting circuit for selecting one memory cell of the memory cell array, a data holding current control circuit and a current suppressing circuit. Each memory cell includes first and second multiemitter transistors. In each memory cell, a base and a collector of a first multiemitter transistor are connected to a collector and a base of a second multiemitter transistor, respectively. First emitters of first and second multiemitter transistors of a memory cell are connected to a second word line of the corresponding row. Collectors of first and second multiemitter transistors of a memory cell are connected to a first word line of the corresponding row through a load. A second emitter of a first multiemitter transistor and a second emitter of a second multiemitter transistor of a memory cell are connected to first and second bit lines of the corresponding column, respectively. The data holding current control circuit causes data holding currents for holding storage data of the selected memory cell to flow onto the second word lines connected to the memory cells not selected by the selection circuit and cutting off the data holding current flowing on the second word line connected to the memory cell selected by the selection circuit in data writing. The current suppressing circuit suppresses either the current flowing between the first multiemitter transistor included in the selected memory cell and the first bit line connected thereto or the current flowing between the second multiemitter transistor included in the selected memory cell and the second bit line connected thereto.

Therefore, according to the present invention, since the data holding current control circuit controls a second word line such that a data holding current does not flow to a selected second word line, it is possible to render conductive any of first and second multiemitter transistors included in the selected memory cell irrespective of the storage data of the other memory cells arranged in the same column as the selected memory cell in a data writing. As a result, a difference between the potentials when a first word line is selected and not selected can be made smaller, thereby reducing an access time. Furthermore, according to one aspect of the present invention, in a semiconductor memory device allowing a word line amplitude to be smaller than a logical amplitude of a memory cell, a leakage current can be cut off between a multiemitter transistor to become non-conductive and the corresponding bit line of the selected memory cell in a data writing. This significantly reduces a time required for inversion writing in particular. Therefore, the semiconductor memory device according to the present invention can achieve both a high speed data reading operation and a high speed data writing operation.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
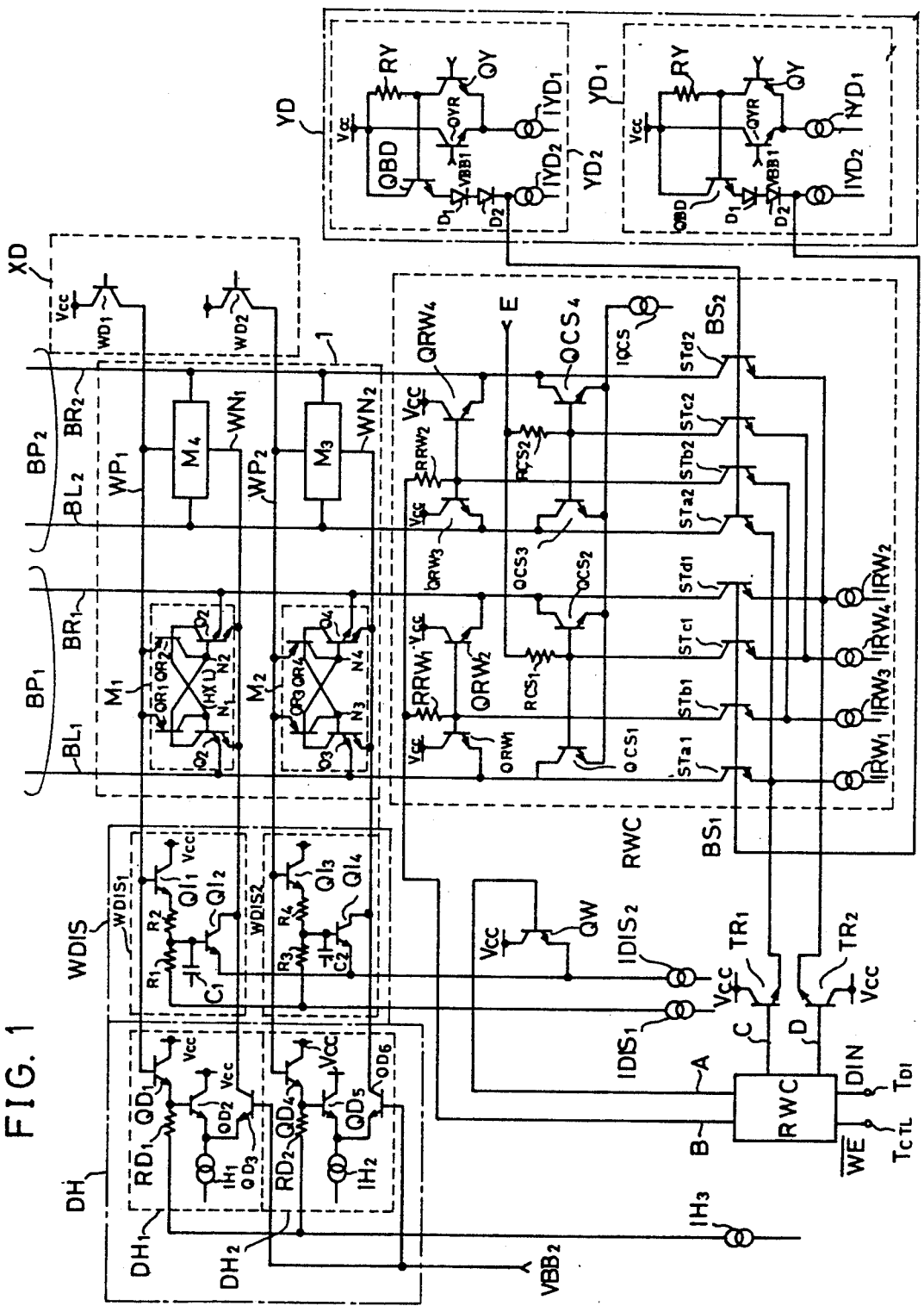
FIG. 1 is a circuit diagram showing an arrangement of a main part of a bipolar SRAM according to one embodiment of the present invention.
Figure 7:
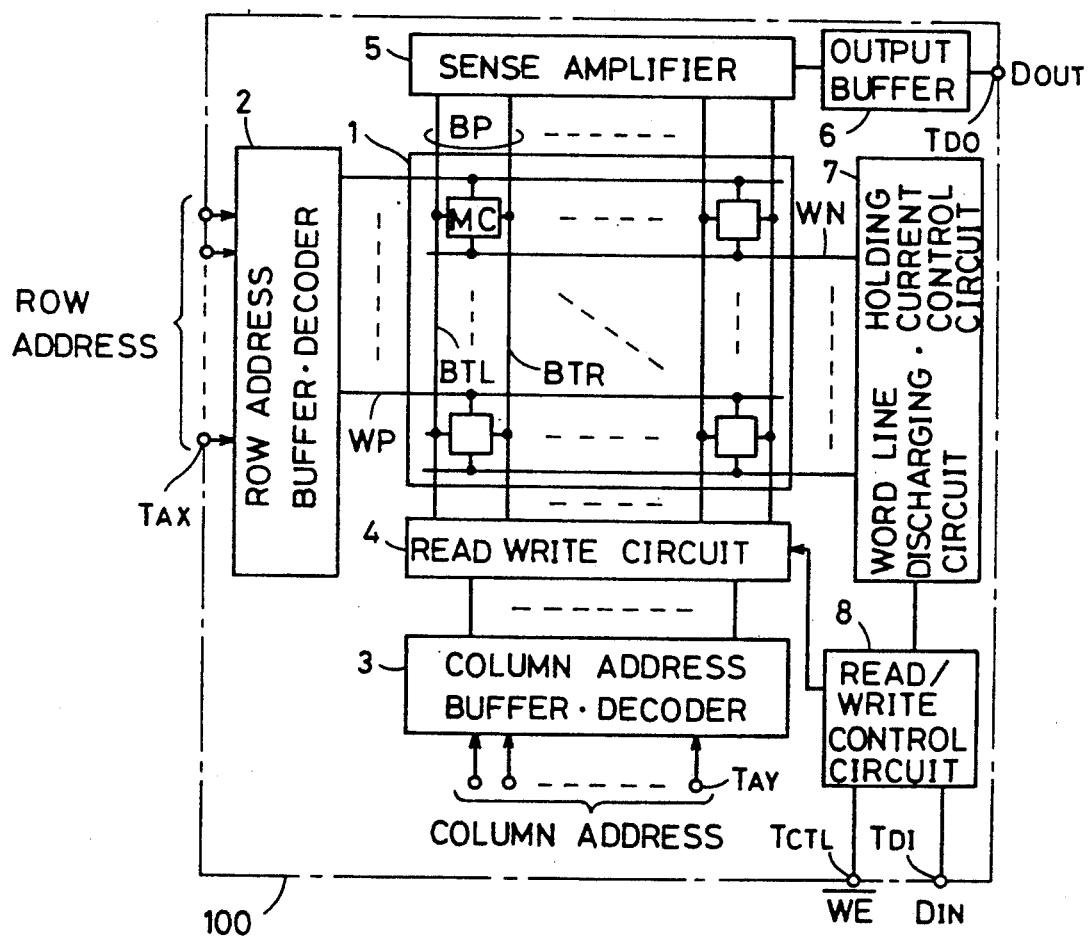
FIG. 7 is a schematic block diagram showing an entire arrangement of a bipolar SRAM.

FIG. 1 is the circuit diagram showing the arrangement of the main part of the bipolar SRAM according to one embodiment of the present invention. Unlike the method disclosed in U.S. Pat. No. 5,536,860, according to this bipolar SRAM, the above-described problem can be solved while a word line amplitude in data writing and that in a data reading kept the same. The entire arrangement of this bipolar SRAM is the same as that shown in FIG. 7, except that in this example, positive word line WP is also connected to word line discharging circuit-holding current source 7 of FIG. 7. The arrangement and operation of this bipolar SRAM will be described in the following.

Figure 8:
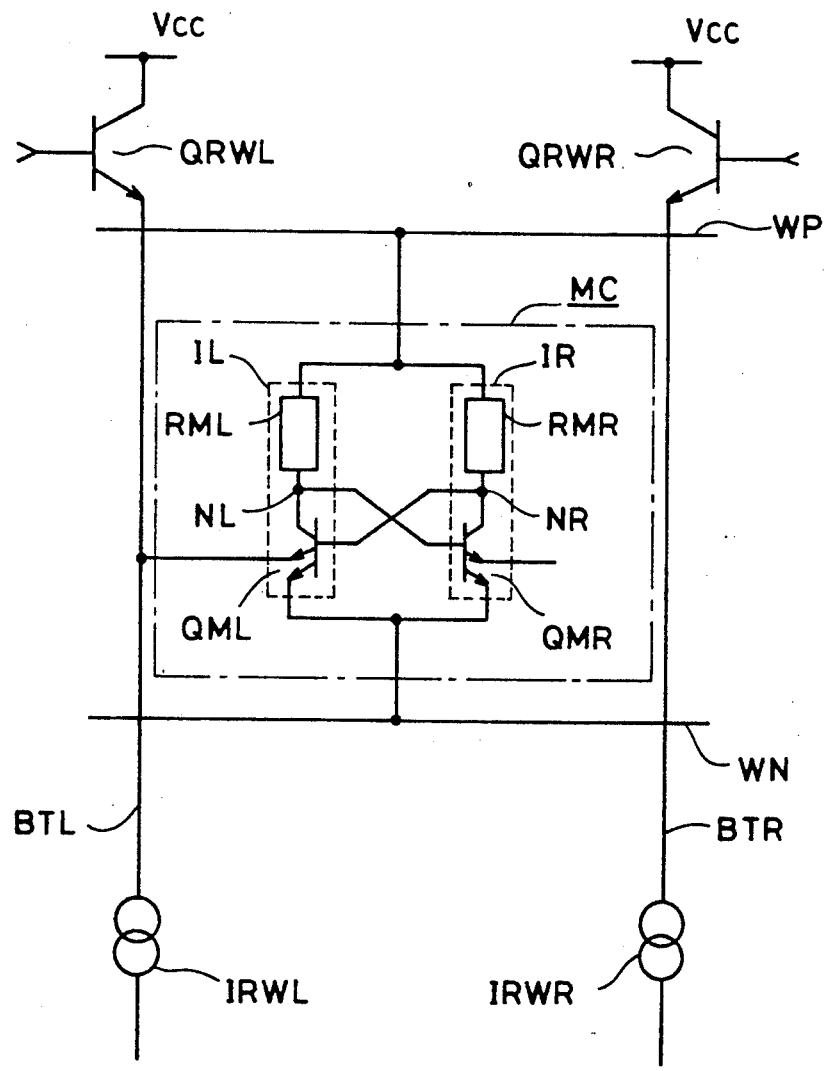
FIG. 8 is a circuit diagram showing a basic arrangement of a memory cell of a bipolar SRAM.

While a memory array 1 shown in FIG. 1 comprises four memory cells M1-M4 arranged in a matrix of two rows and two columns, the array actually includes more memory cells. A basic arrangement of each of memory cells M1-M4 is shown in FIG. 8. In this example, each of loads RML and RMR of FIG. 8 comprises a PNP transistor. That is, with reference to FIG. 1, memory cell M1 comprises an NPN multiemitter transistor Q1 having one emitter connected to a bit line BL1, an NPN multiemitter transistor Q2 having one emitter connected to a bit line BR1, a PNP transistor QR1 having a base connected to the collector of transistor Q1, and a PNP transistor QR2 having a base connected to the collector of transistor Q2. The emitters of transistors QR1 and QR2 are connected to the same positive word line WP1. The collector of transistor QR1 is connected to the bases of transistors QR1 and QR2. The collector of transistor QR2 is connected to the bases of Q2 and QR1. The base connection point between transistors Q1 and QR2 and the base connection point between transistors QR1 and Q2 are storage nodes N1 and N2, respectively, in memory cell M1. Transistors QR1 and QR2 function as loads of transistors Q1 and Q2, respectively. The other emitter of transistor Q1 and the other emitter of transistor Q2 are connected to the same negative word line WN1. A low potential at storage node N1 reduces a resistance of transistor QR2 and a low potential at storage node N2 reduces a resistance of transistor QR1. Bit lines BL1 and BR1 constitute one bit line pair BP1.

Each internal arrangement of the other memory cells M2-M4 is the same as that of the above-described memory cell M1 and the internal circuits of memory cells M3 and M4 are not illustrated for the purpose of simplicity. Memory cell M2 is arranged in the same column as memory cell M1 and provided between bit lines BL1 and BR1. Memory cells M3 and M4 are provided between bit lines BL2 and BR2. Similarly to memory cell M1, memory cell 3 is provided between a positive word line WP2 and a negative word line WN2. Similarly to memory cell M1, memory cell M4 is provided between positive word line WP1 and negative word line WN1.

Figure 9:
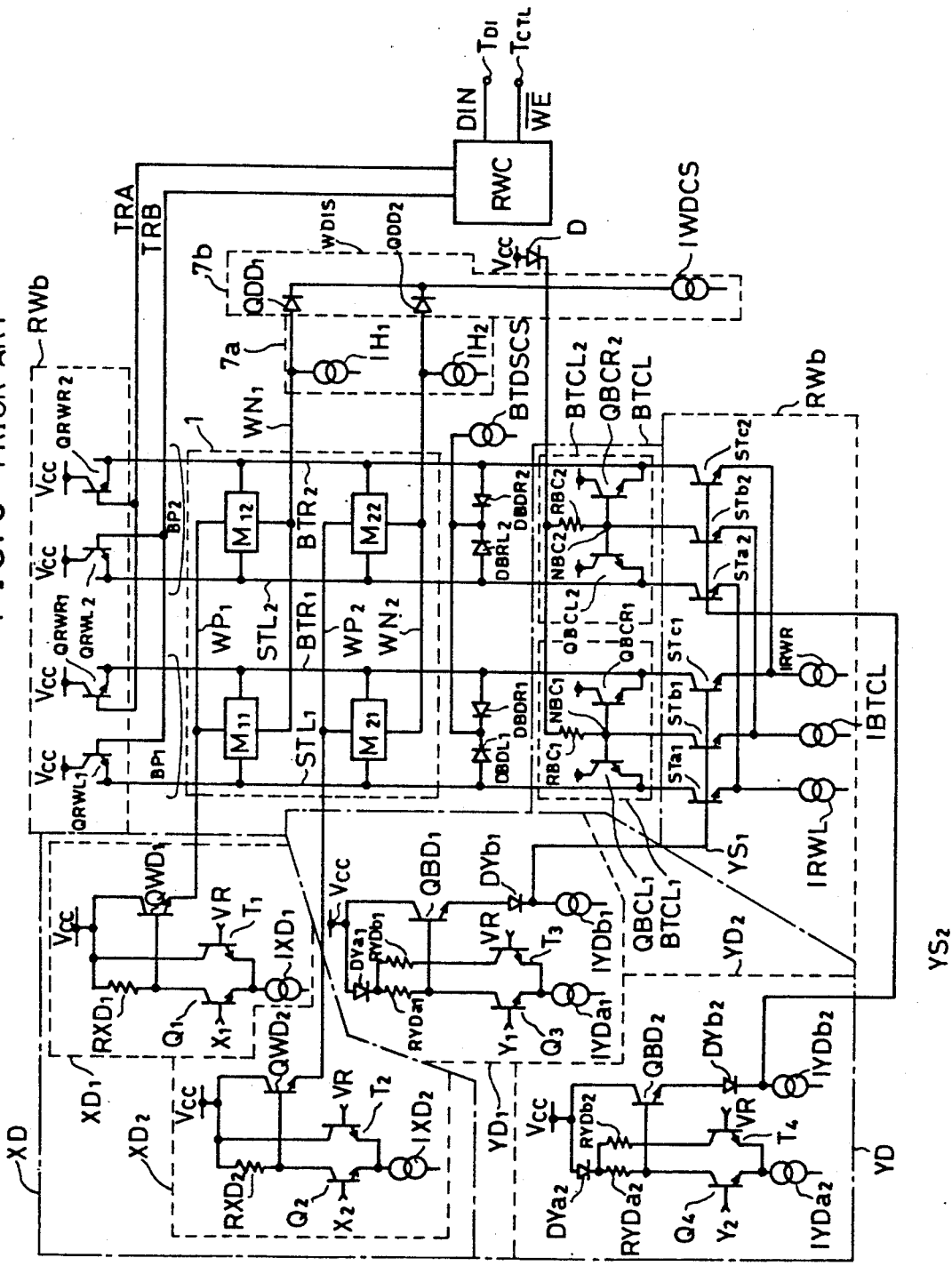
FIG. 9 is a circuit diagram showing an arrangement of the main part of the conventional bipolar SRAM.

A read/write circuit RWc comprises NPN transistors QRW1-QRW4 and QCS1-QCS4. Transistors QRW1-QRW4 carry out both the functions of transistors QBCL1, QBCR1, QBCL2, and QBCR2 constituting a bit line clamp circuit BTCL in FIG. 9 and those of read and write transistors QRWL1, ARWR1, QRWL2 and QRWR2 in FIG. 9, respectively. Transistor QRW1 is provided between bit line BL1 and a power supply $V_{CC}$ and transistor QRW2 is provided between bit line BR1 and power supply $V_{CC}$. The bases of transistors QRW1 and QRW2 are connected to read/write control circuit RWC through a resistor RRW. Transistor QRW3 is provided between bit line BL2 constituting a bit line pair BP2 and power supply $V_{CC}$. Transistor QRW4 is provided between the other bit line BR2 constituting bit line pair BP2 and power supply $V_{CC}$. The bases of transistors QRW3 and QRW4 are connected to read/write control circuit RWC through a resistor RRW2.

The collectors of transistors QCS1 and QCS2 are connected to bit lines BL1 and BR1, respectively. The collectors of transistors QCS3 and QCS4 are connected to bit lines BL2 and BR2, respectively. The emitters of transistors QCS1-QCS4 are connected in common to a constant current source IQCS. The bases of transistors QCS1 and QCS2 and the bases of transistors QCS3 and QCS4 receive a fixed potential E through resistors RCS1 and RCS2, respectively.

Read/write circuit RWc further comprises NPN transistors STa1 and STd1 having collectors connected to bit lines BL1 and BR1, respectively, and NPN transistors STa2 and STd2 having collectors connected to bit lines BL2 and BR2, respectively. Read/write circuit RWc further comprises an NPN transistor STb1 having a collector connected to the base node between transistors QRW1 and QRW2, an NPN transistor STb2 having a collector connected to the base node between transistors QRW3 and QRW4, an NPN transistor STc1 having a collector connected to the base node between transistors QCS1 and QCS2 and an NPN transistor STc2 having a collector connected to the base node between transistors QCS3 and QCS4. The emitters of transistors STa1 and STa2 are connected in common to a constant current source IRW1. The emitter of transistors STd1 and STd2 are connected in common to a constant current source IRW2. The emitters of transistors STb1 and STb2 are connected in common to a constant current source IRW3. The emitters of transistors STc1 and STc2 are connected in common to a constant current source IRW4. Transistors STa1 and STa2, and transistors STd2 and STd1 are connected the emitters of NPN transistors TR1 and TR2 receiving, at the bases, output voltages C and D of read/write control circuit IRWC, respectively.

A row decoder XD selects one word line in a data writing and a data reading. Row decoder XD has the same arrangement as that shown in FIG. 9. For the purpose of simplicity, FIG. 1 shows only word line driving transistors WD1 and WD2 included in row decoder XD. Word line driving transistor WD1 is an NPN transistor provided between power supply $V_{CC}$ and positive word line WP1. The other word line driving transistor WD2 is an NPN transistor provided between power supply $V_{CC}$ and positive word line WP2. In selecting positive word line WP1, the potential on positive word line WP1 is raised to a high potential $V_H$ by transistor WD1. Conversely, in selecting positive word line WP2, the potential on the same is raised to a high potential $V_H$ by transistor WD2.

A column decoder YD selects bit line pairs. Column decoder YD comprises selection circuits YD1 and YD2 provided for paired bit lines BP1 and BP2, respectively. Selection circuits YD1 and YD2 have the same arrangement. The basic arrangement of selection circuits YD1 and YD2 is the same as that shown in FIG. 9. That is, each of selection circuits YD1 and YD2 comprises two NPN transistors QYR and QY constituting an ECL for a constant current source IYD1, and an NPN transistor QBD having a base receiving the collector voltage of transistor QY. The base of transistor QY of selection circuit YD1 receives a low potential ($-1.7$ V) in response to an external address signal designating bit line pair BP1 and receives a high potential ($-0.9$ V) in response to an external address signal not designating bit line pair BP1. Conversely, the base of transistor QY of selection circuit YD2 receives a low potential in response to an address signal designating bit line pair BP2. The base potential $V_{BB1}$ of transistor QYR is set to an intermediate potential ($-1.3$ V) between this high potential and this low potential.

In selecting bit line pair BP1, transistor QY accordingly becomes non-conductive, so that transistor QBD conducts in response to the collector potential of transistor QY raised in response to the output voltage of power supply $V_{CC}$. As a result, a base potential BS1 of transistors STa1, STb1, STc1 and STd1 becomes high. With respect to bit line pair BP2, the transistor QY conducts in the corresponding selection circuit YD2, so that the base potential of transistor QBD falls. As a result, a base potential BS2 of transistors STa2, STb2, STc2 and STd2 becomes low. Transistors STb1 and STc1 conduct and transistors STa1 and STd1 become conductive, accordingly. Then, transistors STa2, STb2, STc2 and STd2 are rendered non-conductive. In this way, in selecting bit line pair BP1, bit lines BL1 and BR1 become electrically connectable to constant current sources IRW1 and IRW2, respectively. At the same time, the base node between transistors QRW1 and QRW2, and the base node between transistors QCS1 and QCS2 are electrically connected to constant current sources IRW3 and IRW4, respectively. Conversely, in selecting bit line pair BP2, the operation of selection circuit YD1 and that of selection circuit YD2 are reverse to those in selecting bit line pair BP1. Therefore, bit lines BL2 and BR2 become connectable to constant current sources IRW1 and IRW2, respectively, and the base node between transistors QRW3 and QRW4 and the base node between transistors QCS3 and QCS4 are connected to constant current sources IRW3 and IRW4, respectively. As the foregoing, selection of a bit line pair is carried out in response to a high potential attained by either of bit line selecting signals BS1 or BS2 from column decoder YD.

As conventional, a word line discharging circuit WDIS accelerates shifts of positive word lines WP1 and WP2 from a selected state to a non-selected state. Word line discharging circuit WDIS includes a discharging circuit WDIS1 for accelerating a shift of positive word line WP1 from a selected state to a non-selected state and a discharging circuit WDIS2 for accelerating a shift of positive word line WP2 from a selected state to a non-selected state. Discharging circuit WDIS1 comprises an NPN transistor QI1 having a base connected to positive word line WP1, resistors R1 and R2 connected in series between the emitter of transistor QI1 and a constant current source IDIS1, an NPN transistor QI2 having a base receiving the potential at the node between resistors R1 and R2, and a capacitor C1 connected to the base of transistor QI2. The collector of transistor QI1 is connected to power supply $V_{CC}$ and the collector and the emitter of transistor QI2 are connected to negative word line WN1 and a constant current source IDIS2, respectively. Discharging circuit WDIS2 has the same arrangement as that of the above-described discharging circuit WDIS1 and is provided corresponding to positive word line WP2 and negative word line WN2. An NPN transistor QW is provided between constant current source IDIS2 and power supply $V_{CC}$. The base of transistor QW receives an output voltage A of read/write control circuit RWC.

Prior to a description of the operation of word line discharging circuit WDIS, the operation of read/write control circuit RWC will be described. In response to a H level write enable signal $\overline{WE}$ designating "data reading", read/write control circuit RWC sets the output signals A and B to a low potential ($-2.6$ V) and a high potential ($-0.8$ V), respectively and both the output signals C and D to a low potential ($-3.2$ V). Furthermore, in response to a L level write enable signal $\overline{WE}$ designating "data writing" and an external input data signal $D_{IN}$, read/write control circuit RWC sets output signals A and B to a high potential ($-1.6$ V) and a read reference potential $V_{RD}$ ($-1.6$ V), respectively and one of output signals C and D and the other thereof to a high potential ($-2.0$ V) and a low potential ($-3.2$ V), respectively.

While positive word line WP1 is selected, transistor QI1 conducts in discharging circuit WDIS1, thereby charging capacitor C1. Similarly, while positive word line WP2 is selected, transistor QI3 conducts in discharging circuit WDIS2, thereby charging a capacitor C2. The base potential applied to transistor QI2 while transistor QI1 is conductive is lower ($-1.8$ V or less) than the potential $V_H$ on a selected positive word line WP1 by the sum of a base-to-emitter voltage $V_{BE}$ of the transistor and a voltage drop across resistor R2. Similarly, the potential applied to a base of a transistor QI4 while positive word line WP2 is selected is lower than the potential $V_H$ by the sum of a base-to-emitter voltage $V_{BE}$, and a voltage drop across resistor R4.

The change of positive word line WP1 from a selected state to a non-selected state renders transistor QI1 non-conductive in discharging circuit WDIS1. As a result, after being maintained at a high potential for a predetermined time period according to a time constant determined by a capacitance value of capacitor C1 and a resistance value of resistor R1, the base potential of transistor QI2 falls. When positive word line WP2 changes form a selected state to a non-selected state, the same phenomenon occurs in discharging circuit WDIS2. That is, the base potential of transistor QI4 is maintained at a high potential for a predetermined time period. Herein, transistor QW and each of transistors QI1 and QI4 constitute an ECL with respect to constant current source IDIS2. Therefore, in a data writing wherein output A of read/write control circuit RWC attains a high potential, transistor QW conducts and transistors QI2 and QI4 become non-conductive when any of positive word lines WP1 and WP2 is selected. Thus, no current is supplied to constant current source IDIS2 from neither negative word line WN1 nor negative word line WN2. That is, word line discharging current flows to neither negative word lines WN1 nor WN2. However, in a data reading wherein output A of read/write control circuit RWC attains a low potential, the one, out of transistors QI2 and QI4, conducts which has the base of a high potential, and the other and transistor QW become non-conductive. Therefore, in a data reading, when any of the selected positive word lines WP1 and WP2 is changed to a non-selected state, the current defined by constant current source IDIS2 flows as a word line discharging current from the corresponding one of negative word lines WN1 and WN2. As a result, either of the selected positive word lines WP1 or WP2 is rapidly restored to the potential of a non-selected state. The details of this word line discharging circuit WDIS are disclosed in U.S. Pat. No. 4,370,736, for example.

A data holdings current control circuit DH controls a data holding current of memory cells M1-M4. This data holding current control circuit DH allows a word line amplitude to be smaller in a data writing than that in a conventional example. Now, the arrangement and the operation of data holding current control circuit DH will be described. Data holding current control circuit DH comprises a holding current control circuit DH1 for controlling a data holding current of memory cells M1 and M4, and a holding current control circuit DH2 for controlling a data holding current of memory cells M2 and M3. Holding current control circuit DH1 includes an NPN transistor QD1 having a gate connected to positive word line WP1, and two NPN transistors QD2 and QD3 constituting an ECL with respect to a constant current source IH1. The emitter of transistor QD1 is connected to the base of transistor QD2. The base of transistor QD2 is connected to a constant current source IH3 through a resistor RD1. Holding current control circuit DH2 has the same arrangement as that of holding current control circuit DH1. Base potentials of transistor QD3 of holding current control circuit DH1 and a transistor QD6 of holding current control circuit DH2 are fixed to an intermediate potential of a word line amplitude. Constant current source IH1 is a holding current source for supplying a data holding current to memory cells M1 and M4 and a constant current source IH2 is a holding current source for supplying a data holding current to memory cells M2 and M3.

When positive word line WP1 is not selected and therefore attains a low potential $V_{NH}$, transistor QD1 is non-conductive in holding current control circuit DH1. The base potential $V_{BB2}$ of transistor QD3 is the potential corresponding to the intermediate of the word line amplitude. That is, the potential $V_{BB2}$ is higher than the potential ($V_{NH}-V_{BE}$) which is lower than the potential of the non-selected word line by the base-to-emitter voltage $V_{BE}$ and lower than the potential ($V_H-V_{BE}$) which is lower than the potential $V_H$ on the selected word line by the base emitter-to-voltage $V_{BE}$. Transistor QD2 therefore becomes non-conductive and transistor QD3 conducts. As a result, a current is supplied to constant current source IH1 from negative word line WN1 through transistor QD3. In other words, the data holding current of memory cells M1 and M4 flows to negative word line WN1. However, when positive word line WP1 is selected to attain a high potential, transistor QD1 conducts, thereby applying a high potential to the base of transistor QD2 through transistor QD1. As a result, the base potential of transistor QD2 becomes higher than that of transistor QD3, so that transistor QD2 becomes conductive and transistor QD3 becomes non-conductive. As a result, constant current source IH1 is supplied with a current from transistor QD2 and with no current from transistor QD3. That is, no data holding current flows to negative word line WN1. Holding current control circuit DH2 also operates similarly to holding current control circuit DH1 with respect to the corresponding word lines WP2 and WN2. In other words, when positive word line WP2 is not selected, the circuit causes the data holding current of memory cells M2 and M3 to flow to negative word line WN2. Conversely, when positive word line WP2 is selected, holding current control circuit DH2 cuts off the data holding current of memory cells M2 and M3. As the foregoing, data holding current control circuit DH operates to cut off the data holding currents of all the memory cells connected to the selected word line.

Figure 2:
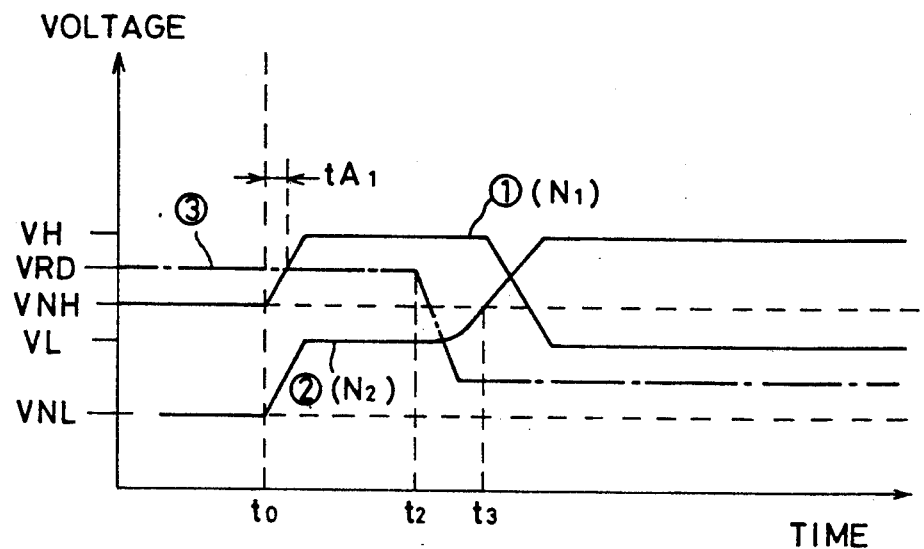
FIG. 2 is a timing chart explaining an operation of the bipolar SRAM shown in FIG. 1.

A data writing operation and a data reading operation of this bipolar SRAM will be described in the following. FIG. 2 will be referred to in the following description. FIG. 2 is the timing chart showing the data reading operation and the data writing operation of the bipolar SRAM. The data reading principle of this bipolar SRAM is the same as that of a conventional one.

The data reading operation will be first described, taking data reading from memory cell M1 as an example. In this description, it is assumed that H level and L level potentials are held at storage nodes N1 and N2 of memory cell M1.

In data reading from memory cell M1, row decoder XD raises the potential on positive word line WP1 to a potential $V_H$ ($-1.0$ V) of a selected state. At the same time, column decoder YD raises the base potentials BS1 of transistors STa1, STb1, STc1 and STd1 to high potentials ($-2.4$ V). As a result, the current paths are activated which are between the bases of transistors QRW1 and QRW2 and the corresponding constant current source IRW3, and between the bases of transistors QCS1 and QCS2 and the corresponding constant current source IRW4. Outputs C and D of read/write control circuit RWC are set to be low enough not to render transistors TR1 and TR2 conductive, respectively. Thus, transistors STa1 and STd1 become conductive, thereby activating the current paths between the bit line pair BP1 and constant current sources STa1 and STd1. On the other hand, output B of read/write control circuit RWC attains a high potential ($-0.8$ V). The potential of this signal B is lowered by a voltage drop across resistor RRW1 to attain a reading reference level $V_{RD}$ ($-1.6$ V), which potential is applied to the bases of transistors QRW1 and QRW2.

When positive word line WP1 changes from a non-selected state to a selected state at a time $t_0$ in FIG. 2, the conductive transistor QR1 causes the potential at storage node N1 of memory cell M1 to rise from the potential $V_{NH}$ at a non-selected state to approximately the same potential as the potential $V_H$ of on positive word line WP1 as shown by ① of FIG. 2. On the other hand, with transistor QR2 being non-conductive, the potential at storage node N2 rises to the potential $V_L$ lower than that at storage node N1 as the potential on positive word line WP1 rises as shown by ② of FIG. 1.

The base potential $V_{RD}$ of transistors QRW1 and QRW2 is set to a value between the potential $V_H$ and the potential $V_L$. Therefore, similarly to a conventional one, transistor Q1 conducts out of the transistors each having the emitter connected to bit line BL1, thereby setting the potential on bit line BL1 to a potential lower than the potential $V_H$ by a base-to-emitter voltage $V_{BE}$ of the transistor. Only the transistor QRW2 conducts out of the transistors each having the emitter connected to bit line BR1. As a result, the potential on bit line BR1 is set to a potential lower than the base potential $V_{RD}$ of transistor QRW2 by the potential $V_{BE}$. A not-shown sense amplifier senses the potential difference between these bit lines BL1 and BR1 to read the storage data of memory cell M1.

The data holding currents of memory cells M1 and M4 connected to the selected word line WP1 are cut off by data holding current control circuit DH. However, word line discharging circuit WDIS causes the current defined by constant current source IDIS1 to flow to negative word line WN1. The storage data of memory cells M1 and M4 is therefore maintained by the word line discharging current.

Then, the writing operation will be described taking an inversion of storage data of memory cell M1 as an example. In this description, it is assumed that the storage nodes N1 and N2 of memory cell M1 already maintain H level and L level potentials, respectively and storage nodes N3 and N4 of memory cell M2 already maintain L level and H level potentials, respectively.

First, in the case where a word line amplitude is large, wherein a potential $V_{NH}$ at a storage node maintaining a H level potential in a non-selected memory cell is lower than a potential $V_L$ at a storage node maintaining a L level potential in a selected memory cell, the potential levels at storage nodes N1 and N2 of memory cell M1 are inverted through the same circuit operation as that of the conventional one. The circuit operation in that case will be first described.

In writing data to memory cell M1, row decoder XD and column decoder YD select positive word line WP1 and bit line pair BP1, respectively. As a result, the potentials at storage nodes N1 and N2 of memory cell M1 rise to potentials $V_H$ and $V_L$ of a selected state. Meanwhile, in the data writing, output B of read/write control circuit RWC attains a reading reference level $V_{RD}$. Therefore, the base potentials of transistors QRW1 and QRW2 becomes the potential ($-2.4$ V) lower than the potential $V_{RD}$ by a voltage drop (0.8 V) due to resistor RRW1.

At the same time, outputs C and D of read/write control circuit RWC attain a high potential (−2.0 V) and a low potential (−3.2 V) in response to an input data signal $D_{IN}$, respectively. As a result, transistor STa1 is turned off, transistors STd1 is turned on. Consequently, bit line BR1 is connected to constant current source IRW2. At this time, since the base potential $V_L$ of transistor Q2 is higher than the base potential $V_{NH}$ of transistor Q4 and the base potential ($V_{RD}$−0.8 V) of transistor QRW2, transistor Q2 is changed from non-conductive to conductive. As a result, the current is generated to flow from the collector of transistor Q2 to bit line BR1, thereby dropping the potential at storage node N1. When the potential at storage node N1 becomes lower than the base potentials of transistors Q3 and QRW1, transistor Q1 becomes non-conductive. The potentials at storage nodes N1 and N2 eventually become a L level potential $V_L$ of a selected state and a H level potential $V_H$ of a selected state, respectively.

Figure 10:
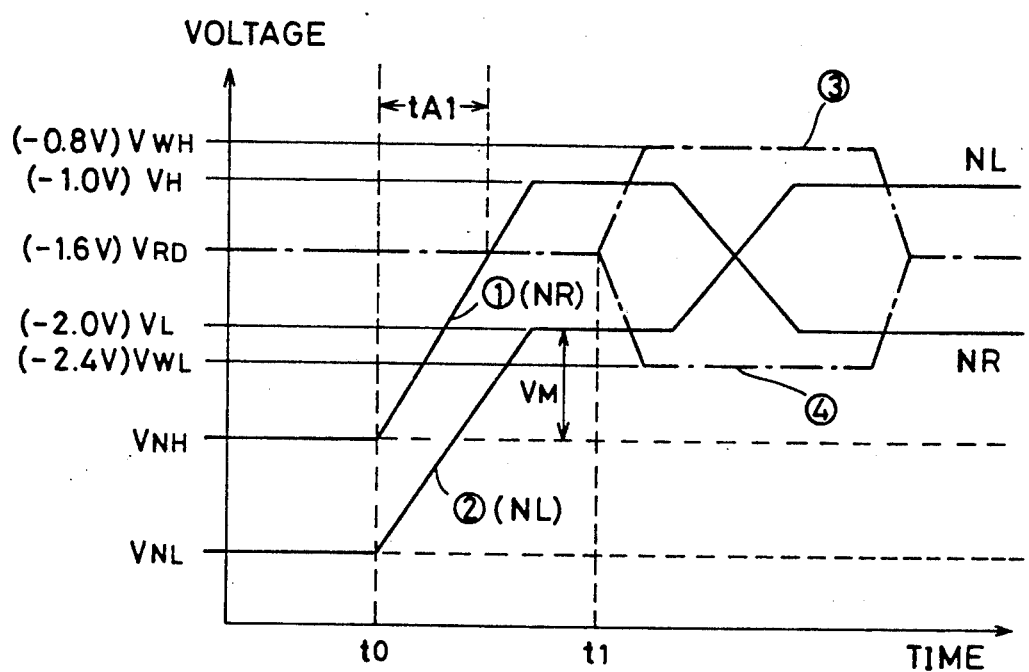
FIG. 10 is a timing chart explaining an operation of the conventional bipolar SRAM.

Description will be given of a circuit operation when a word line amplitude ($V_H$-$V_{NH}$) is smaller than a logical amplitude of a memory cell, that is, when a potential $V_L$ is lower than a potential $V_{NH}$ at a storage node maintaining a H level of a non-selected memory cell with reference to FIG. 2. According to the conventional bipolar SRAM shown in FIG. 10, the storage data of memory cell M1 cannot be inverted in such a case. However, according to this bipolar SRAM, the storage data of memory cell M1 can be inverted as a result of such a circuit operation as follows. First, similarly in the previous case, positive word line WP1 is raised to a potential $V_H$ by row decoder XD, whereby bit line pair BP1 is selected by column decoder YD. As a result, the base potentials of transistors Q1 and Q2 rise to potentials $V_H$ and $V_L$, respectively, in memory cell M1. At the same time, the base potentials (FIG. 2 ③) of transistors QRW1 and QRW2 also become $V_{RD}$−0.8 V in response to output B of read/write control circuit RWC as in the previous case (at time ② of FIG. 2). However, since the potential $V_{NH}$ is higher than the potential $V_L$, transistor Q4 attains the highest base potential among transistors Q2, Q4 and QRW2 each having the emitter connected to bit line BR1. Thus, differently from the previous case, transistor Q4 of the non-selected memory cell M2 conducts and transistor Q2 of memory cell M1 remains non-conductive. However, differently from the conventional one, negative word line WN1 corresponding to the selected positive word line WP1 and constant current sources IH1 and IDHS2 are electrically cut off by word line discharging circuit WDIS and data holding current control circuit DH, respectively. In addition, the current path between bit line BL1 and constant current source IRW1 is inactivated. Therefore, no current is generated which flows from transistor Q1 of the selected memory cell M1 to negative word line WN1 and bit line BL1, so that no charge flows out from storage node N2 through transistor Q1. The charges supplied from positive word line WP1 through load transistor QR1 gradually raise the potential at storage node N2 (② of FIG. 2)(after the write starting time t₂ of FIG. 2). Then, when the potential at storage node N2 exceeds the base potential $V_{NH}$ of transistor Q4 (at a time t₃ of FIG. 2), transistor Q2 conducts and transistor Q4 becomes non-conductive. Similarly to the previous case, the conduction of transistor Q2 causes a current flowing from transistor Q2 through bit line BR1 to constant current source IRW2, whereby the collector potential of transistor Q2 (the potential at storage node N1) abruptly falls as indicated by ① of FIG. 2. As a result, load transistor QR2 becomes conductive, so that the potential at storage node N2 abruptly rises after the time t₃ of FIG. 2 to become a potential $V_H$ on positive word line WP1.

As the foregoing, according to this bipolar SRAM, even if a word line amplitude is smaller than a logical amplitude $V_H$-$V_L$ of a memory cell, it is possible to invert storage date of an arbitrary memory cell. The word line amplitude can accordingly be made smaller than that of a conventional one. As a result, a charge-/discharge time period can be reduced at which a word line is changed from a selected state to a non-selected state and vice versa, thereby reducing an access time to be less than that of the conventional one.

According to the bipolar SRAM, in a data writing, the data holding currents of all the memory cells connected to the selected word line and the word line discharging current are cut off. As a result, in the data writing, the storage data of the non-selected memory cells connected to the same word line as that of the selected memory cell might be damaged. In order to prevent the damage, transistors QCS1-QCS4 are provided.

In the case of such a data writing as described above, for example, transistor STc1 conducts with respect to the selected bit line pair BP1, so that the base potentials of transistors QCS1 and QCS2 are lowered. On the other hand, transistor STc2 is non-conductive with respect to the non-selected bit line pair BP2, so that the base potentials of transistors QCS3 and QCS4 are not lowered. As a result, while transistors QCS1 and QCS2 become non-conductive, transistors QCS3 and QCS4 conduct, whereby the non-selected bit line pair BP2 is electrically connected to constant current source IQCS. At the same time, transistor STb2 provided corresponding to the non-selected bit line pair BP2 is non-conductive, so that the base potentials of transistors QRW2 an QRW4 become equal to the potential $V_{RD}$ of output B of read/write control circuit RWC. As a result, a current flows from memory cell M4 to bit line BL2 or bit line BR2 according to the storage data of memory cell M4. In a data reading, a transistor having a base connected to a storage node maintaining a H level conducts and a transistor having a base connected to a storage node maintaining a L level becomes non-conductive in a memory cell connected to a selected word line. That is, the non-selected bit line pair BP2 enters the same state as that of the data reading, thereby preventing damage of the storage data of the non-selected memory cell M4 connected to the selected word line WP2.

Figure 3:
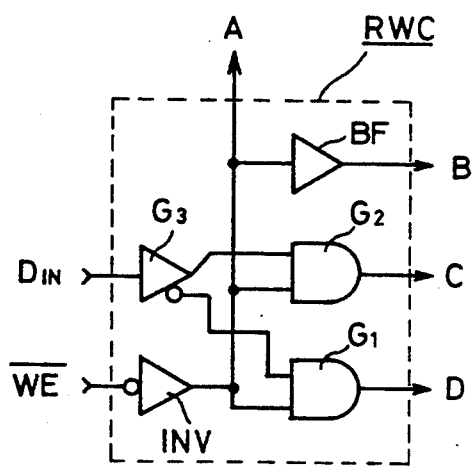
FIG. 3 is a circuit diagram showing a specific example of an arrangement of the reading/writing control circuit RWC shown in FIG. 1.

FIG. 3 is the circuit diagram showing one example of an arrangement of a read/write control circuit RWC. With reference to FIG. 3, when a write enable signal $\overline{WE}$ is at a H level indicative of a "reading mode", one input of a two-input AND gate G1 is supplied with a L level potential from an inverter INV. At the same time, one input of a two-input AND gate G2 is also supplied with a L level potential from inverter INV. Therefore, both the outputs of AND gates G1 and G2 attain a L level irrespective of the potentials at the other input ends. The outputs of these AND gates G1 and G2 are outputs D and C of read/write control circuit RWC, respectively. The L level output of inverter INV is an output A of read/write control circuit RWC. Furthermore, a buffer BF adjusts the output potential of inverter INV to a predetermined high potential (−0.8 V)

and outputs the high potential as an output B of read/write control circuit RWC.

Conversely, when write enable signal $\overline{WE}$ is at a L level indicative of "writing mode", inverter INV applies a H level potential to one input end of each of AND gates G1 and G2 and buffer BF. In this case, therefore, the outputs of AND gates G1 and G2 are determined by the potentials at the other input ends, respectively. The other input end of AND gate G1 and the other input end of AND gate G2 are supplied with potentials of the levels complementary with each other from a gate G3. Outputs D and C of AND gates G1 and G2 accordingly attain the potentials complementary with each other. Gate G3 applies a non-inversion signal of an input data signal $D_{IN}$ to AND gate G2 and an inversion signal of input data signal $D_{IN}$ to AND gate G1. Therefore, the potential levels of outputs C and D of read/write control circuit RWC change in response to a change in a logical level of input data signal $D_{IN}$. Buffer BF adjusts a H level output potential of inverter INV to the reading reference level $V_{RD}$ ($-1.6$ V) and outputs the adjusted level potential. At this time, output A of read/write control circuit RWC attains a H level in response to the output of inverter INV.

As the foregoing, according to this bipolar SRAM, the data holding current and the word line discharging current flowing from the selected positive word line to the corresponding negative word line are cut off in a data writing. A bit line on a multiemitter transistor side having a collector connected to a storage node to attain a H level of a selected memory cell becomes incapable of conducting. As a result, even if a word line amplitude is smaller than a logical amplitude of a memory cell data of a selected memory cell can be rewritten irrespective of storage data of a memory cell connected to the same bit line as that of the selected memory cell. With such an arrangement, however, an additional problem as follows arises.

Consideration will be given for example to a case wherein storage nodes N1 and N2 of memory cell M1 maintain H level and L level potentials, respectively, in FIG. 1. In this case, when the data is read from memory cell M1, the above-described circuit operation results in the conduction of transistor Q1 with respect to bit line BL1 and the conduction of transistor QRW2 with respect to bit line BR1. As a result, the potential on bit line BL1 becomes a potential $V_H - V_{BE}$ lower than a base potential $V_H$ of transistor Q1 by a voltage $V_{BE}$ and the potential on bit line BR1 becomes a potential $V_{RD} - V_{BE}$ lower than a base potential $V_{RD}$ of transistor QRW2 by a voltage $V_{BE}$. At this time, word line discharging circuit WDIS causes a data holding current to flow from memory cells M1 and M4 to negative word line WN1. Now, consideration will be given to a data writing to memory cell M1 subsequent to this data reading.

In a data writing wherein the potentials at storage nodes N1 and N2 of memory cell M1 are inverted to a L level and a H level, respectively, read/write control circuit RWC applies a high potential ($-2.0$ V) to the emitter of transistor STa1. In such a data reading, transistor STa1 accordingly becomes non-conductive. In addition, in a data writing, word line discharging circuit WDIS cuts off a word line discharging current. As a result, bit line BL1 enters a floating state from a state wherein it is fixed to a potential $V_H - V_{BE}$.

At this time, since the base potential of transistor Q1 is a potential $V_H$ higher than the potential ($V_H - V_{BE}$) on bit line BL1, forward bias is applied between the base and emitter of transistor Q1. Therefore, a current is supplied onto bit line BL1 from transistor Q1 in effect. Although this leakage current is small, it is a current preventing a potential rise of storage node N2 (the collector of transistor Q1), that is, a data holding current of memory cell M1. This current continues to flow until the charging of bit line BL1 is finished. FIG. 5 is the timing chart showing the operations of the bipolar SRAM shown in FIG. 1 and the bipolar SRAM according to the embodiment shown in FIG. 4 in a data writing. As indicated by ③ of FIG. 5, the potential at storage node N2 does not rapidly rise after the start of the data writing but rises to a potential $V_H$ costing much time (several hundreds nsec). The potential at storage node N1 falls following the potential rise of storage node N2 as described above. Therefore, as indicated by ④ of FIG. 5, when the potential rise of storage node N2 is slow, the potential at storage node N1 starts falling at a time point where after the start of the data writing, the potential at storage node N2 rises above the base potentials of transistors Q4 and QRW2 costing much time. As a result, more time (writing time $T_W$) is required for inverting the data of memory cell M1.

As the foregoing, the bipolar SRAM according to the above-described embodiment requires more time for a data writing when a data reading and a data writing are successively carried out for a memory cell connected to the same bit line pair.

Figure 4:
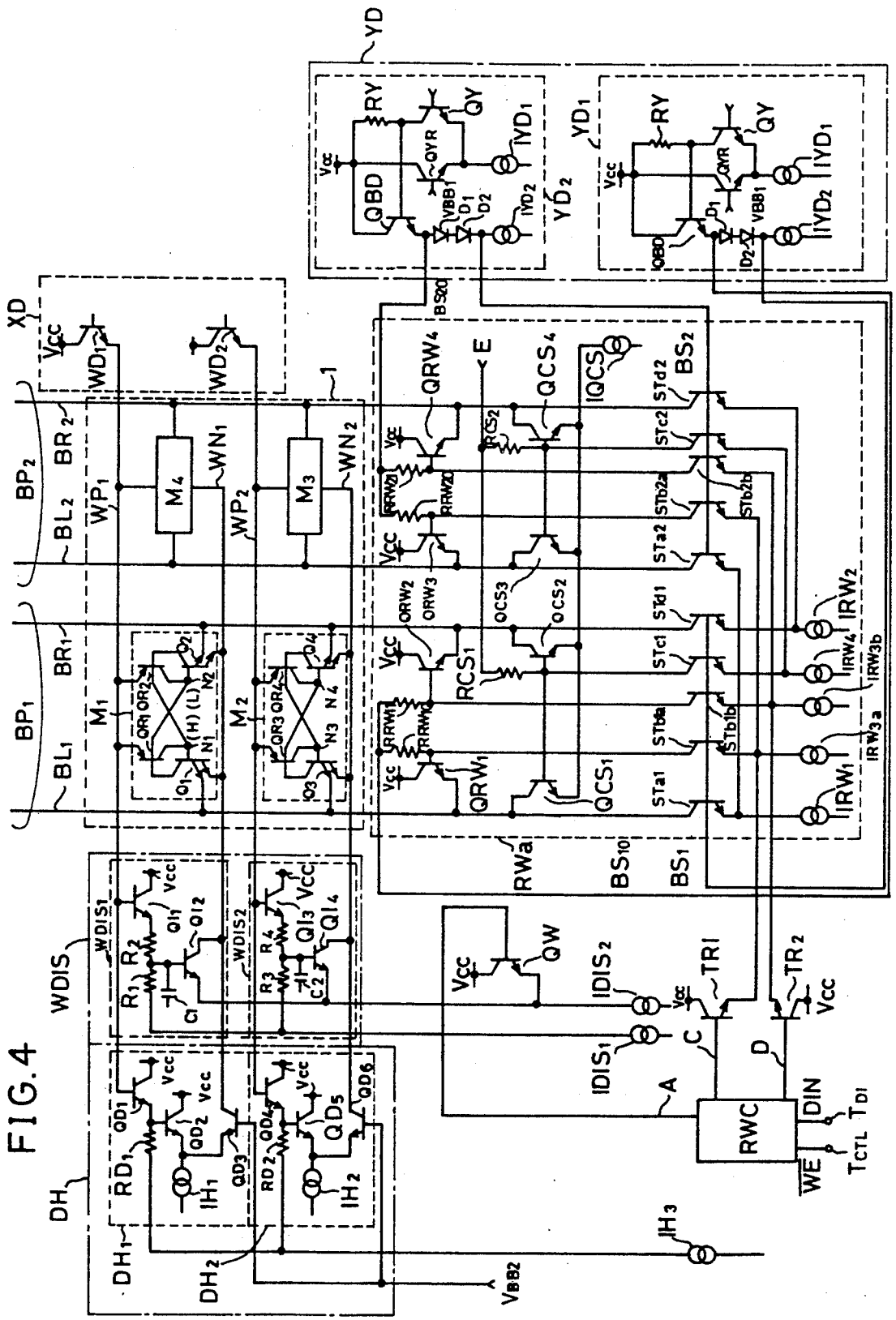
FIG. 4 is a circuit diagram showing an arrangement of a main part of a bipolar SRAM according to another embodiment.
Figure 5:
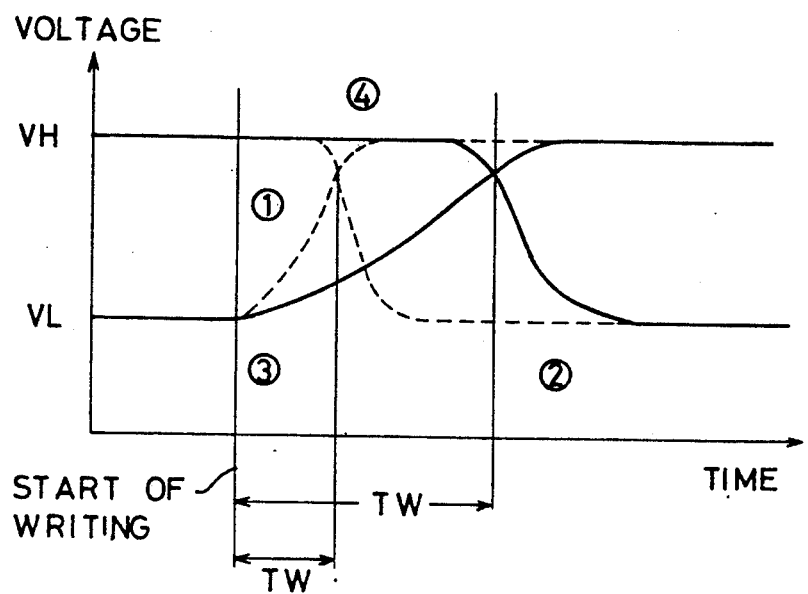
FIG. 5 is a timing chart showing a data writing operation of a bipolar SRAM shown in FIG. 4.

FIG. 4 is the circuit diagram showing the arrangement of the main part of the other bipolar SRAM achieved by improving the previous embodiment in order to avoid such an inconvenience and showing the other embodiment of the present invention. The entire arrangement of this bipolar SRAM is the same as that shown in FIG. 7.

In order to clarify the difference between the present embodiment and the conventional bipolar SRAM shown in FIG. 1, a description will be give to the part of the circuit arrangement shown in FIG. 1 which is different from the circuit arrangement shown in FIG. 4.

With reference to FIG. 4, in a read/write circuit RWa according to the present embodiment, bases of reading and writing transistors QRW1 to QRW4 are connected to a column decoder YD on the corresponding bit line pair basis. That is, the bases of transistors QRW1 and QRW2 are connected to an emitter of a transistor QBD in a column decoder YD1 corresponding to the bit line pair BP1 through resistors RRW10 and RRW11, respectively. Similarly, the bases of transistors QRW3 and QRW4 are connected to an emitter of a transistor QBD of a column decoder YD2 through resistors RRW20 and RRW21, respectively. A constant current source IRW3a to be used in common is provided corresponding to transistors QRW1 and QRW3 and a constant current source IRW3b to be used in common is provided corresponding to transistors QRW2 and QRW4. The bases of transistors QRW1 and QRW2 are connected to constant current sources IRW3a and IRW3b through separate NPN transistors STB1a and STb1b, respectively. Similarly, the bases of transistors QRW3 and QRW4 are connected to constant current sources IRW3a and IRW3b through separate NPN transistors STb2a and STb2b.

Furthermore, differently from the conventional one, an output C of a read/write control circuit RWC is applied to transistor STB1a for controlling the base potential of transistor ORW1 and to the emitter of transistor STb2a for controlling the base potential of transistor ORW3. An output D of read/write control circuit RWC is applied to transistor STB1b for controlling the base potential of transistor QRW2 and to the emitter of transistor STb2b for controlling the base potential of transistor QRW4.

As the foregoing, in this embodiment the output of column decoder YD is applied to the bases of transistors QRW1 to QRW4 through the resistors, and therefore the output B of read/write control circuit RWC is eliminated which conventionally determines the base potentials of transistors QRW1 to QRW4.

The arrangement and the operation of the other parts of this bipolar SRAM and a relation between the potentials applied to the respective nodes are the same as those of the bipolar SRAM shown in FIG. 1.

A data reading operation and a data writing operation of this bipolar SRAM will be described in the following. It is assumed in this description that storage nodes N1 and N2 of memory cell M1 maintain H level and L level potentials, respectively.

First, a data reading operation will be described. In case of a data reading from memory cell M1, for example, as a potential on a selected word line WP1 rises, base potentials of transistors Q1 and Q2 rise to potentials $V_H$ ($-1.0$ V) and $V_L$ ($-2.0$ V), respectively. Meanwhile, transistor QBD of column decoder YD1 conducts, so that an emitter potential BS10 of transistor QBD attains a high potential of $-V_{BE}$ ($= -0.8$ V). Therefore, transistors STa1, STc1 and STd1 conduct and transistors STB1a and STb1b enter a state allowing current flow. On the other hand, both outputs C and D of read/write control circuit RWC are at a low potential ($-3.2$ V), whereby transistors STB1a and STb1b become conductive. As a result, a current flows through resistors RRW10 and RRW11, thereby dropping the potential of output BS10 of column decoder YD1 by a voltage drop due to resistors RRW10 and RRW11, which output is applied to the bases of transistors QRW1 and QRW2. Consequently, the base potentials of transistors QRW1 and QRW2 are set to a reading reference level $V_{RD}$ ($-1.6$ V) as in a conventional one. Similar to the conventional one, transistor Q1 conducts with respect to a bit line BL1 and transistor QRW2 conducts with respect to a bit line BR1, thereby producing a potential difference between bit lines BL1 and BR1 corresponding to the storage data of memory cell M1. The data can be therefore read from memory cell M1 as in the case of a conventional bipolar SRAM.

In column decoder YD, an output BS20 of column decoder YD2 attains a low potential ($-1.6$ V). All of the transistors STa2, STb2a, STb2b, STc2 and STd2 enter a state allowing current flow, so that no data is read from memory cells M3 and M4 onto a bit line BP2.

A writing operation will be described with reference to FIG. 4 and FIG. 5.

It is assumed for example that storage nodes N1 and N2 of memory cell M1 maintain H level and L level potentials, respectively and the storage data of this memory cell M1 is inverted. In a data writing to memory cell M1, a selection operation of a column decoder XD raises the potentials at storage nodes N1 and N2 to potentials $V_H$ and $V_L$, respectively. At the same time, the potential of output BS10 of column decoder YD1 attains a high potential ($-0.8$ V). Meanwhile, in a data writing, outputs C and D of read/write control circuit RWC attain a high potential ($-2.0$ V) and a low potential respectively, thereby rendering transistor STb1b ($-3.2$) conductive and transistor STB1a non-conductive. Therefore, no current flows through resistor RRW10, whereby the base potential of transistor QRW1 attains a high potential equal to that of output BS10 of column decoder YD1. On the other hand, the current flows through resistor RRW11, so that the base potential of transistor QRW2 becomes a potential lower than the potential of output BS10 of column decoder YD1 by a voltage drop due to resistor RRW11, that is, it becomes a reading reference potential $V_{RD}$.

As the foregoing, in this embodiment, a base potential of reading and writing transistor QRW1 attains a high potential ($-0.8$ V) in a data reading, which transistor is provided at the side of transistor Q1 which is to become non-conductive in the selected memory cell M1. At the same time, the data holding current and the word line discharging current flowing from positive word line WP1 to a negative word line WN1 are cut off by a word line discharging circuit WDIS and a data holding current control circuit DH. With a high potential applied to the base of transistor QRW1, therefore, no current flows from the emitter of transistor Q1 to bit line BL1. On the other hand, the collector of transistor Q1 is supplied with a low potential $V_L$ of storage node N2. Therefore, a forward bias is applied between the base and the collector of transistor Q1, thereby generating a current flowing from the base to the collector of transistor Q1. As a result, storage node N2 is supplied with electric charges from transistor Q1, whereby the potential at storage node N2 rapidly rises after the start of the data writing as indicated by ① of FIG. 5. When the potential at storage node N2 exceeds the base potential of transistor Q4 and the base potential $V_{RD}$ of transistor QRW2, transistor Q2 conducts to supply a current to bit line BR1. In response thereto, the potential at storage node N1 falls. The potential at storage node N1 therefore falls more rapidly than conventional after the start of the data writing as indicated by ② of FIG. 5. That is, the storage data of memory cell M1 is rewritten in a shorter time period than conventional.

Conversely, in writing the same data as the holding data to memory cell M1, outputs C and D of write/read control circuit RWC attains a high potential and a low potential, respectively. Therefore, contrary to the previous case, the base potential of transistor QRW1 becomes the potential $V_{RD}$ lower than the base potential of transistor Q1. In this case, transistor Q1 immediately conducts, so that the storage data of memory cell M1 is not changed.

In a data writing, while a discharging current of a selected word line and data holding currents of all the memory cells connected to the selected word line are cut off, the base potentials of reading and writing transistors QRW3 and QRW4 provided corresponding to the non-selected bit line pair are set to the reading reference potential $V_{RD}$ by column decoder YD2 as in a conventional one. The non-selected bit line pair BP2 accordingly enters the same state as that in the data reading, so that the data of the non-selected memory cell M4 connected to the selected word line WP1 is not damaged.

As the foregoing, according to the present embodiment, a reverse bias is forcibly applied between a base and an emitter of a transistor which is to become non-conductive in a selected memory cell in a data writing. As a result, a leakage current from a transistor in a selected memory cell to a bit line is cut off which current conventionally deteriorates a writing speed, thereby drastically reducing a data writing time period $T_W$ as compared with a conventional one. The bipolar SRAM according to the present embodiment allows reduction in the data writing time period $T_W$ to below 5 nsecs.

Figure 6:
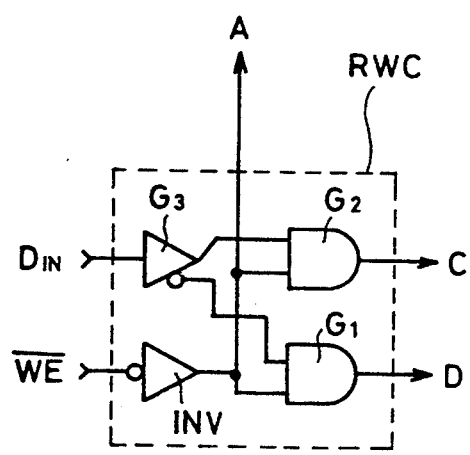
FIG. 6 is a circuit diagram showing a specific example of an arrangement of the reading/writing control circuit RWC shown in FIG. 4.

FIG. 6 is the circuit diagram showing one specific example of the arrangement of read/write control circuit RWC of FIG. 4. Referring to FIG. 6, this read/write control circuit RWC has the same arrangement as the conventional one (FIG. 3) shown in FIG. 1 with a buffer BF eliminated therefrom. Similar to the read/write control circuit shown in FIG. 3, the outputs of two-input AND gates G1 and G2 become outputs D and C of this read/write control circuit RWC, respectively and the output of inverter INV becomes output A of the read/write control circuit RWC. Therefore, in a data reading wherein write enable signal $\overline{WE}$ attains a H level, output A attains a H level and both outputs C and D attain a L level. Then, in a data writing wherein write enable signal $\overline{WE}$ attains a L level, output A attains a L level and outputs C and D attain complementary potentials according to input data signal $D_{IN}$. As the foregoing, according to the present embodiment, since there is no need of obtaining a signal from a read/write control circuit which signal determines gate potentials of reading and writing transistors QRW1–QRW4, the arrangement of read/write control circuit RWC can be made simpler than that according to the previous embodiment.

While in any of the above-described embodiments, the descriptions are given of a case wherein a PNP transistor is used as a load in a memory cell and an NPN transistor is used as a transistor to be connected to a bit line, the same effects as those of the disclosed embodiments can be obtained by applying the present invention to a bipolar SRAM including a memory cell having another arrangement. In addition, the same effects as those of the disclosed embodiments can be obtained by applying the present invention to a bipolar SRAM without a word line discharging circuit.

A specific circuit arrangement of a bipolar SRAM according to the present invention is not limited to those shown in FIGS. 1 and 4 but any arrangement can be used which achieves a function of cutting off both or only the former of a data holding current flowing through a selected negative word line and a leakage current generated between a transistor to become non-conductive and a bit line in a data writing. In addition, potentials to be applied to the respective nodes are not limited to those of the values indicated in the parenthesis for describing the circuit operations.

The present invention is also applicable to a memory, for example, a serial access memory wherein memory cells are selected in the order of address in a data reading and a data writing.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A static semiconductor memory device having a memory cell array including a plurality of memory cells arranged in a matrix of rows and columns,
   each of said memory cells including first and second multiemitter transistor means,
   said first multiemitter transistor means having a base, a first emitter, second emitter and a collector,
   said second multiemitter transistor means having a first emitter, a second emitter, a collector and a base, wherein said base and said collector are connected to said collector and said base of said first multiemitter transistor means, respectively,
   the device further comprising:
   first and second word lines provided corresponding to said respective rows,
   first and second bit lines provided corresponding to said respective columns,
   said first emitters of said first and second multiemitter transistor means of each of said plurality of memory cells being connected to said second word line in the corresponding row,
   said collectors of said first and second multiemitter transistor means of each of said plurality of memory cells being connected to said first word line in the corresponding row,
   said second emitter of said first multiemitter transistor means of each of said plurality of memory cells and said second emitter of said second multiemitter transistor means of the same being connected to first and second bit lines in the corresponding column, respectively,
   means for selecting one memory cell of said plurality of memory cells,
   data holding current controlling means for causing a data holding current for holding the storage data of said selected memory cells to flow through said second word lines connected to the memory cells not selected by said selecting means and for cutting off said data holding current flowing to said second word line connected to the memory cell selected by said selecting means in data writing, and
   bit line conduction state controlling means responsive to the data to be written for rendering conductive one of the first and the second bit lines connected to the memory cell selected by said selecting means and rendering the other non-conductive in the data writing.

2. The static semiconductor memory device according to claim 1, wherein said selecting means comprises:
   word line selecting means for raising the potential on said first word line provided corresponding to one of said rows to a high potential of a word line selecting potential and lowering the potentials on said first word lines provided corresponding to all the other respective rows to a low potential of a word line non-selecting potential to select said first and second word lines corresponding to said one row, and
   bit line selecting means for selecting said first and second bit lines provided corresponding to said one column by controlling said first and second bit lines provided corresponding to one of said columns to be rendered conductive by said bit line conduction state controlling means.

3. The static semiconductor memory device according to claim 2, wherein said data holding current controlling means comprises:
   first constant current sources each provided corresponding to each of said second word lines, and
   first connection controlling means for electrically connecting said respective second word lines corresponding to all of said first word lines not selected by said word line selecting means with the corresponding said first constant current sources and electrically cutting off said second word line selected by said word line selecting means from the corresponding said first constant current source.

4. The static semiconductor memory device according to claim 2, wherein said bit line conduction state controlling means comprises:
   second constant current sources each provided corresponding to each of said first bit lines and said second bit lines, and
   second connection controlling means for electrically connecting one of said first bit line and said second bit line selected by said bit line selecting means with the corresponding said second constant current source and electrically cutting off the other from the corresponding said second constant current source in the data writing.

5. The static semiconductor memory device according to claim 4, further comprising:
   first transistor means provided between each of said first bit lines and the corresponding one of said second constant current sources, and
   second transistor means provided between each of said second bit lines and the corresponding one of said second constant current sources,
   said first transistor means having a collector connected to the corresponding one of said first bit lines, an emitter connected to the corresponding one of said second constant sources and a base,
   said second transistor means having a collector connected to the corresponding one of said second bit lines, an emitter connected to the corresponding one of said second constant current sources and a base.

6. The static semiconductor memory device according to claim 5, wherein
   said bit line selecting means includes bit line selecting potential applying means for applying a high potential of a bit line selecting potential to the bases of said first transistor means and said second transistor means corresponding to said first bit line and said second bit line, respectively, provided corresponding to one of said columns and applying a low potential of a bit line non-selecting potential to the bases of all the other of said first and second transistor means,
   said second connection controlling means includes:
      first control transistor means having an emitter connected to the emitter of said first transistor means, a collector connected to a power supply and a base and for controlling on/off of said first transistor means,
      second control transistor means having an emitter connected to the emitter of said second transistor means, a collector connected to said power supply and a base and for controlling on/off of said second transistor means, and
      base potential supplying means for supplying potentials complementary with respect to said bit line selection potential to the base of said first control transistor means and the base of said second control transistor means in the data writing.

7. The static semiconductor memory device according to claim 3, wherein
   said first connection controlling means includes:
      third and fourth transistor means provided corresponding to said respective first constant current sources,
      each of said third transistor means having an emitter connected to the corresponding one of said first constant current sources, a collector connected to the power supply and a base,
      each of said fourth transistor means having an emitter connected to the corresponding one of said first constant current sources, a collector connected to the corresponding one of said second word lines and a base receiving a reference potential, and
      base potential controlling means for controlling to complementary potentials with respect to said reference potential said base of said third transistor means corresponding to said selected second word line and said base of said third transistor means corresponding to each of said non-selected second word lines.

8. The static semiconductor memory device according to claim 7, wherein
   said base potential controlling means includes fifth transistor means provided corresponding to said respective first word lines,
      each of said fifth transistor means having a base connected to the corresponding one of said first word lines, an emitter connected to said base of said third transistor means corresponding to said second word line corresponding to said corresponding first word line.

9. The static semiconductor memory device according to claim 5, wherein polarity of said first and second transistor means is NPN type.

10. The static semiconductor memory device according to claim 7, wherein polarity of said third and fourth transistor means is NPN type.

11. The static semiconductor memory device according to claim 8, wherein polarity of said fifth transistor means is NPN type.

12. The static semiconductor memory device according to claim 4, further comprising means for forcing to be conductive one of said first and second multiemitter transistor means included in said memory cell connected to said selected first and second bit lines in the data writing.

13. The static semiconductor memory device according to claim 12, wherein
   said forcing means includes:
   sixth and seventh transistor means provided corresponding to said respective columns,
      each of said sixth transistor means having an emitter connected to said first bit line of the corresponding said column, a collector connected to the power supply and a base,
      each of said seventh transistor means having an emitter connected to said second bit line of said corresponding column, a collector connected to said power supply and a base, and
   first potential applying means for applying a first potential to both of said bases of said sixth transistor means and said seventh transistor means provided corresponding to said selected first and second bit lines in the data writing,
      said first potential being lower than said base potential of the one in conduction state out of said first and second multiemitter transistor means included in said selected memory cell.

14. The static semiconductor memory device according to claim 13, wherein said first potential is lower than said word line non-selecting potential.

15. The static semiconductor memory device according to claim 2, further comprising word line discharging current controlling means for causing a word line discharging current for promoting the discharging of arbitrary one of said first word lines to flow through said second word line corresponding to arbitrary one of said first word lines in response to the potential on said arbitrary first word line changing from word line selecting potential to said word line non-selecting potential.

16. The static semiconductor memory device according to claim 15, wherein said word line discharging current controlling means includes:
   a third constant current source,
   third connection controlling means provided corresponding to said respective rows and for controlling to electrically connect each of said corresponding second word lines with said third constant current source in response to the change of the potential on said first word line of the corresponding row from said word line selecting potential to said word line non-selecting potential, and
   means for disabling each of said third connection controlling means in the data writing.

17. The static semiconductor memory device according to claim 16, wherein
   each of said third connection controlling means includes:
      eighth transistor means having a collector connected to said second word line of the corresponding row, an emitter connected to said third constant current source and a base, and
      means for maintaining the potential of said base of said eighth transistor means at a high potential for a fixed time period in response to the change of said first word line of said corresponding row from said word line selecting potential to said word line no-selecting potential,
   said disabling means includes:
      ninth transistor means having an emitter connected to said third constant current source, a collector connected to said power supply and a base, and
      high potential applying means for applying a potential higher than said high potential to said base of said ninth transistor means in the data writing.

18. The static semiconductor memory device according to claim 17, wherein polarity of said eighth and ninth transistor means is NPN type.

19. The static semiconductor memory device according to claim 16, further comprising data damage preventing means for preventing damage of the storage data of each of said memory cells connected to said first and second bit lines not selected by said bit line selecting means and connected to said first and second word lines selected by said word line selecting means, in the data writing.

20. The static semiconductor memory device according to claim 19, wherein said data damage preventing means includes:
   a fourth constant current source, and
   fourth connection controlling means for electrically connecting all of said first and second bit lines not selected by said bit line selecting means with said fourth constant current source and electrically cutting off said first and second bit lines selected by said bit line selecting means from said fourth constant current sources.

21. The static semiconductor memory device according to claim 1, wherein each polarity of said first multiemitter transistor means and said second multiemitter transistor means is NPN type.

22. A static semiconductor memory device having a memory cell array including a plurality of memory cells arranged in a matrix of rows and columns,
   each of said plurality of memory cells including first and second multiemitter transistor means,
      said first multiemitter transistor means having a base, first emitter, a second emitter and a collector,
      said second multiemitter transistor means having first emitter, a second emitter and a base and a collector connected to said collector and said base of said first multiemitter transistor means, respectively,
   the memory device comprising:
   first and second word lines provided corresponding to said respective rows,
   first and second bit lines provided corresponding to said respective columns,
      each of said first emitters of said first and second multiemitter transistor means of said memory cell being connected to said second word line in the corresponding row,
      each of said collectors of said first and second multiemitter transistor means of said memory cell being connected to said first word line of the corresponding row,
      said second emitter of each of said first multiemitter transistor means and said second emitter of said second multiemitter transistor means of said memory cell being connected to the first and the second bit lines, respectively, of the corresponding column,
   means for selecting one memory cell of said plurality of memory cells,
   data holding current controlling means for causing a data holding current for holding the storage data of said selected memory cell to flow through said second word lines connected to said memory cells not selected by said selecting means and cutting off said data holding current flowing through said second word line connected to said memory cell selected by said selecting means in a data writing,
   bit line controlling means responsive to the data to be written for rendering conductive one of said first and second bit lines connected to said memory cell selected by said selecting means and fixing the other bit line to a potential higher than the base potential of one transistor means being connected to said the other out of said first and second multiemitter transistor means of said selected memory cell.

23. The static semiconductor memory device according to claim 22, wherein said selecting means comprises:
   word line selecting means for raising the potential on said first word line provided corresponding to one of said rows to a high potential of a word line selecting potential and lowering the potentials on said first word lines provided corresponding to all the other respective rows to a low potential of a word line non-selecting potential to select said first and second word lines corresponding to said one row, and bit line selecting means for selecting said first and second bit lines provided corresponding to said one column to by controlling said first and second bit lines provided corresponding to one of said columns to be rendered conductive by said bit line controlling means.

24. The static semiconductor memory device according to claim 23, wherein said data holding current controlling means comprises:

first constant current sources each provided corresponding to each of said second word lines, and first connection controlling means for electrically connecting said respective second word lines corresponding to all of said first word lines not selected by said word line selecting means with the corresponding said first constant current sources and electrically cutting off said second word line selected by said word line selecting means from the corresponding said first constant current source.

25. The static semiconductor memory device according to claim 23, wherein said bit line controlling means includes:

first and second transistor means provided corresponding to said respective columns, each of said first transistor means having an emitter connected to said first word line of the corresponding one of said columns, a collector connected to a power supply and a base, each of said second transistor means having an emitter connected to said second word line of the corresponding one of said columns, a collector connected to said power supply and a base, base potential controlling means for raising to a high potential said base of one of said first and second transistor means connected to said first and second bit lines selected by said bit line selecting means, respectively, and lowering said base of the other transistor means to a low potential in the data writing.

26. The static semiconductor memory device according to claim 25, further comprising:

second constant current sources each provided corresponding to each of said first bit lines and said second bit lines, third transistor means each provided between each of said first bit lines and the corresponding one of said second constant current sources, and fourth transistor means provided between each of said second bit lines and the corresponding one of said second constant current sources, said third transistor means having a collector connected to the corresponding one of said first bit lines, an emitter connected to the corresponding one of said second constant current sources and a base, said fourth transistor means having a collector connected to the corresponding one of said second bit lines, an emitter connected to the corresponding one of said second constant current sources and a base.

27. The static semiconductor memory device according to claim 26, wherein said bit line selecting means includes bit line selecting potential applying means provided corresponding to one of said columns for applying a high potential of a bit line selecting potential to the bases of said third transistor means and said fourth transistor means corresponding to said first bit line and said second bit line, respectively, and applying a low potential of a bit line non-selecting potential to the bases of all the other said third and fourth transistor means.

28. The static semiconductor memory device according to claim 24, wherein said first connection controlling means includes:

fifth and sixth transistor means provided corresponding to each of said first constant current sources, said fifth transistor means having an emitter connected to the corresponding one of said first constant current sources, a collector connected to the power supply and a base, said sixth transistor means having an emitter connected to the corresponding one of said first constant current sources, a collector connected to the corresponding one of said second word lines and a base receiving a reference potential, and controlling means for controlling said base of said fifth transistor means corresponding to said selected second word line and said bases of said fifth transistor means corresponding to said respective non-selected second word lines to complementary potentials with respect to said reference potential.

29. The static semiconductor memory device according to claim 28, wherein said controlling means includes seventh transistor means provided corresponding to said respective first word lines, each of said seventh transistor means having a base connected to the corresponding one of said first word lines, an emitter connected to said base of said fifth transistor means corresponding to said second word line corresponding to said corresponding first word line and a collector connected to said power supply.

30. The static semiconductor memory device according to claim 25, wherein said low potential is lower than said base potential of the non-conductive one of said first and second multiemitter transistor means included in said memory cell connected to said selected first and second bit lines and lower than said word line non-selecting potential.

31. The static semiconductor memory device according to claim 23, further comprising word line discharging current controlling means responsive to the potential on arbitrary one of said first word lines changing from said word line selecting potential to said word line non-selecting potential for causing a word line discharging current for promoting discharging of said arbitrary first word line to flow through said second word line corresponding to said arbitrary first word line.

32. The static semiconductor memory device according to claim 31, wherein said word line discharging current controlling means includes:

third constant current sources, second connection controlling means provided corresponding to said respective rows for electrically connecting said corresponding second word line with said third constant current source in response to said first word line potential of the corresponding one of said rows from said word line selecting potential to said word line non-selecting potential, and means for disabling each of said second connection controlling means in a data writing.

33. The static semiconductor memory device according to claim 32, wherein each of said second connection controlling means includes:

eighth transistor means having a collector connected to said second word line of said corresponding row, an emitter connected to said third constant current source and a base, and means responsive to said first word line potential of corresponding one of said rows changing from said word line selecting potential to said word line non-selecting potential for maintaining said base potential of said eighth transistor means at a high potential for a fixed time period, said disabling means includes:

ninth transistor means having an emitter connected to said third constant current source, a collector connected to said power supply and a base, and second potential applying means for applying a second potential higher than said high potential to said base of said ninth transistor means in the data writing.

34. The static memory device according to claim 33, wherein each polarity of said eighth and ninth transistor means is NPN type.

35. The static memory device according to claim 32, further comprising data damage preventing means for preventing damage of the storage data of each of said memory cells connected to said first and second bit lines not selected by said bit line selecting means and connected to said first and second word lines selected by said word line selecting means in the data writing.

36. The static semiconductor memory device according to claim 35, wherein said data damage preventing means includes:

fourth constant current source, third connection controlling means for electrically connecting all of said first and second bit lines not selected by said bit line selecting means with said fourth constant current source and for electrically cutting off said first and second bit lines selected by said bit line selecting means from said fourth constant current source.

37. The static semiconductor memory device according to claim 25, wherein said base potential controlling means includes, fifth constant current sources each provided corresponding to each of said first transistor means and said second transistor means, fourth connection controlling means for electrically connecting said base of one of said first transistor means and said second transistor means connected to said selected first and second bit lines, respectively, with corresponding one of said fifth constant current source and electrically cutting off said base of the other transistor means from corresponding one of said fifth constant current source, and high potential applying means for applying said high potential through a load to said base of each of said first transistor means and second transistor means connected to said selected first and second bit lines, respectively, in the data writing.

38. The static semiconductor memory device according to claim 37, further comprising:

second constant current sources each provided corresponding to each of said first bit lines and said second bit lines, third transistor means each provided between each of said first bit lines and the corresponding one of said second constant current sources, and fourth transistor means each provided between each of said second bit lines and the corresponding one of said second constant current sources, each of said third transistor means having a collector connected to the corresponding one of said first bit lines, an emitter connected to the corresponding one of said second constant current sources and a base, each of said fourth transistor means having a collector connected to the corresponding one of said second bit lines, an emitter connected to the corresponding one of said second constant current sources and a base.

39. The static semiconductor memory device according to claim 38, wherein said high potential applying means and said bit line selecting means comprise in common means for applying a high potential to said bases of said first and third transistor means corresponding to said first bit line and said second bit line, respectively, of one column of said columns and to said bases of said second and fourth transistor means.

40. The static semiconductor memory device according to claim 25, wherein each polarity of said first and second transistor means is NPN type.

41. The static semiconductor memory device according to claim 25, wherein each polarity of said third and fourth transistor means is NPN type.

42. The static semiconductor memory device according to claim 28, wherein each polarity of said fifth and sixth transistor means is NPN type.

43. The static semiconductor memory device according to claim 29, wherein the polarity of said seventh transistor means is NPN type.

44. The static semiconductor memory device according to claim 22, wherein each polarity of said first multiemitter transistor means and said second multiemitter transistor means is NPN type.

45. The static semiconductor memory device according to claim 37, wherein said fourth connection controlling means includes:

tenth transistor means each corresponding to each of said first transistor means and having a collector connected to the base of the corresponding one of said first transistor means, an emitter connected to the corresponding one of said fifth constant current sources and a base, eleventh transistor means each provided corresponding to each of said second transistor means and having a collector connected to the base of the corresponding one of said first transistor means, an emitter connected to the corresponding one of said fifth constant current sources and a base, first control transistor means having an emitter connected to the emitters of said tenth transistor means, a collector connected to the power supply and a base and for controlling on/off of said tenth transistor means, second control transistor mean-s having an emitter connected to the emitters of said eleventh transistor means, a collector connected to said power supply and a base and for controlling on/off of said eleventh transistor means, and base potential supplying means for supplying complementary potentials with respect to said bit line selecting potential to the base of said first control transistor means and the base of said second control transistor means, the base of said tenth transistor means corresponding to said first transistor means connected to said selected first bit line and the base of said eleventh transistor means corresponding to said second transistor means connected to said selected second bit line receiving said bit line selecting potential.

46. The static semiconductor memory device according to claim 37, wherein said base potential supplying means includes:
inverter means for receiving a write data signal to be written in any of said plurality of memory cells as an input,
first logic gate means responsive to a write control signal for controlling the data writing to said memory cell and to the output of said inverter means for generating a potential to be supplied to the gate of said first control transistor means, and
second logic gate means responsive to said write control signal and said write data signal for generating a potential having the inversion of the level of the potential generated in said first logic gate means, to be supplied to the gate of said second control transistor means.

47. The static semiconductor memory device according to claim 6, wherein said base potential supplying means includes:
inverter means for receiving a write data signal to be written in any of said plurality of memory cells as an input,
first logic gate means responsive to a write control signal for controlling the data writing to said memory cell and to the output of said inverter means for generating a potential to be supplied to the gate of said first control transistor means, and
second logic gate means responsive to said write control signal and said write data signal for generating a potential having the inversion of the level of the potential generated in said first logic gate means to be supplied to the gate of said second control transistor means.

48. A static semiconductor memory device having a memory cell array including a plurality of memory cells arranged in a matrix of rows and columns,
each of said memory cells including first and second multiemitter transistor means,
said first multiemitter transistor means having a base, a first emitter, a second emitter and a collector,
said second multiemitter transistor means having a first emitter, a second emitter and a base and a collector connected to said collector and said base of said first multiemitter transistor means, respectively, the semiconductor memory device comprising:
first and second word lines provided corresponding to said respective rows,
first and second bit lines provided corresponding to said respective columns,
said first emitters of said first and second multiemitter transistor means of each of said plurality of memory cells being connected to said second word line of the corresponding row,
said collectors of said first and second multiemitter transistor means of each of said plurality of memory cells being connected to said first word line of the corresponding row,
said second emitter of said first multiemitter transistor means of each of said plurality of memory cells and said second emitter of said second multiemitter transistor means of the same being connected to first and second bit lines of the corresponding column,
means for selecting one memory cell of said plurality of memory cells,
data holding current controlling means for causing a data holding current for holding the storage data of said selected memory cell to flow through said second word lines connected to said memory cells not selected by said selecting means and cutting off said data holding current flowing through said second word line connected to said memory cell selected by said selecting means in a data writing, and
current suppressing means for suppressing either the current flowing between said first multiemitter transistor means included in the memory cell selected by said selecting means and said first bit line connected thereto or the current flowing between said second multiemitter transistor means included in said selected memory cell and said second bit line connected thereto.

* * * * *